(12) United States Patent
Lee et al.

(10) Patent No.: US 12,596,447 B2
(45) Date of Patent: *Apr. 7, 2026

(54) DEVICE FOR DETECTING AND ACTIVE INPUT

(71) Applicant: SAMSUNG DISPLAY CO., LTD., Yongin-si (KR)

(72) Inventors: Dong-Hoon Lee, Hwaseong-si (KR); Haemin Kim, Gumi-si (KR); Myunghoon Park, Suwon-si (KR); Byungchang Yu, Seosan-si (KR); Kyunghoon Chung, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/921,960

(22) Filed: Oct. 21, 2024

(65) Prior Publication Data

US 2025/0053255 A1     Feb. 13, 2025

Related U.S. Application Data

(63) Continuation of application No. 18/055,818, filed on Nov. 15, 2022, now Pat. No. 12,141,384.

(30) Foreign Application Priority Data

Jan. 25, 2022     (KR) ........................ 10-2022-0010490

(51) Int. Cl.
*G06F 3/041* (2006.01)
*G06F 3/044* (2006.01)
(Continued)

(52) U.S. Cl.
CPC ........ *G06F 3/0412* (2013.01); *G06F 3/04162* (2019.05); *G06F 3/044* (2013.01);
(Continued)

(58) Field of Classification Search
CPC .... G06F 3/0412; G06F 3/044; G06F 3/04162; H10K 59/131; H10K 59/40; H10K 59/1213; G09G 3/32
See application file for complete search history.

(56) References Cited

U.S. PATENT DOCUMENTS

2016/0209957 A1     7/2016     Jung et al.
2017/0123569 A1     5/2017     Kim et al.
(Continued)

FOREIGN PATENT DOCUMENTS

CN          113050831          6/2021
KR          10-1581672 B1     12/2015
(Continued)

*Primary Examiner* — Lisa S Landis
(74) *Attorney, Agent, or Firm* — F. CHAU & ASSOCIATES, LLC

(57)          ABSTRACT

A display device includes a display panel and an input sensor. The input sensor may include a first sensing electrode, a signal line electrically connected to a first terminal of the first sensing electrode, a first line at least partially overlapping the first sensing electrode and extending in the same direction as the first sensing electrode in the active area, and a first switching element defining a first current path in the first sensing electrode and the first line or blocking the first current path.

20 Claims, 18 Drawing Sheets

(51) Int. Cl.

| | | |
|---|---|---|
| *G09G 3/32* | (2016.01) | |
| *H10K 50/844* | (2023.01) | |
| *H10K 59/121* | (2023.01) | |
| *H10K 59/131* | (2023.01) | |
| *H10K 59/40* | (2023.01) | |

(52) U.S. Cl.

CPC ............. *G09G 3/32* (2013.01); *H10K 50/844* (2023.02); *H10K 59/1213* (2023.02); *H10K 59/131* (2023.02); *H10K 59/40* (2023.02); *G06F 2203/04101* (2013.01); *G06F 2203/04103* (2013.01); *G06F 2203/04111* (2013.01); *G09G 2300/0408* (2013.01); *G09G 2300/0819* (2013.01)

(56) References Cited

U.S. PATENT DOCUMENTS

| | | | |
|---|---|---|---|
| 2020/0081571 A1* | 3/2020 | Kim ...................... | H10K 59/40 |
| 2023/0236686 A1 | 7/2023 | Lee et al. | |

FOREIGN PATENT DOCUMENTS

| | | | |
|---|---|---|---|
| KR | 10-1808339 | B1 | 12/2017 |
| KR | 10-1918146 | B1 | 11/2018 |
| KR | 10-2259239 | B1 | 6/2021 |

* cited by examiner

DD

ISP
ES
SM  } DP
BL

I                                                    I'

DP-CL  DP-OLED

DD

ISP

DP-OLED
TFL
DP-CL  } DP
BL

< Mode 1 >

E1 { E1-1
     E1-2

E2 { E2-1
     E2-2

< Mode 2 >

$$E1 \begin{cases} E1{-}1 \\ E1{-}2 \end{cases}$$

$$E2 \begin{cases} E2{-}1 \\ E2{-}2 \end{cases}$$

FIG. 9A

DEVICE FOR DETECTING AND ACTIVE INPUT

CROSS-REFERENCE TO RELATED APPLICATIONS

This U.S. non-provisional patent application is a Continuation of co-pending U.S. patent application Ser. No. 18/055,818, filed on Nov. 15, 2022, which claims priority under 35 U.S.C. § 119 to Korean Patent Application No. 10-2022-0010490, filed on Jan. 25, 2022, the entire contents of which are hereby incorporated by reference.

TECHNICAL FIELD

The present disclosure herein relates to a device and more particularly, to a display device or an electronic device capable of sensing a passive-type input and an active-type input.

DISCUSSION OF THE RELATED ART

Multimedia electronic devices such as a television, a mobile phone, a tablet computer, a vehicle navigation unit, and a portable game console include a display device for displaying an image. These electronic devices may include not only a typical input device such as a button, a keyboard, or a mouse but may also include an input sensor capable of providing a touch-based input method allowing a user to easily input information or commands in an intuitive and convenient manner.

The input sensor may sense an applied pressure or a touch generated by using a user's body. While detecting a touch of a user's finger is widely used, a more precise touch input may be achieved through the use of an active pen (e.g., an active stylus). The use of an active pen may be particularly beneficial where the user executes a program for sketching or drawing.

SUMMARY

A display device includes a base layer having an active area and a peripheral area disposed beside the active area. A circuit element layer is disposed on the base layer and includes a pixel transistor. A display element layer is disposed on the circuit element layer and the display element layer includes a light emitting element electrically connected to the pixel transistor. A thin film encapsulation layer is disposed on the display element layer. A plurality of insulation layers is disposed on the thin film encapsulation layer. A first sensing electrode is disposed on the thin film encapsulation layer. The first sensing electrode extends in a first direction and is disposed on the active area. A second sensing electrode is disposed on the thin film encapsulation layer. The second sensing electrode extends in a second direction crossing the first direction and is disposed on the active area. A first signal line is electrically connected to a first terminal of the first sensing electrode. A second signal line is electrically connected to a first terminal of the second sensing electrode. A first line overlaps the first sensing electrode in the active area and extends in the first direction in the active area. A second line overlaps the second sensing electrode in the active area and extends in the second direction in the active area. A first switching element defines a first current path in the first sensing electrode and the first line or block the first current path. A second switching element defines a second current path in the second sensing electrode and the second line or block the second current path.

The first line and the second line may receive a bias voltage.

The display device may further include a connection signal line electrically connected to a second terminal opposite to the first terminal of the first sensing electrode in the first direction. The first switching element may be disposed between the connection signal line and the first line.

The connection signal line may be disposed above one insulation layer of the plurality of insulation layers. The first line may be disposed below the one insulation layer of the plurality of insulation layers.

The first switching element may include a switching transistor having a same structure and disposed on a same layer as the pixel transistor.

The first switching element may be disposed on the peripheral area.

The first switching element may be turned-on by a first switching signal to define the first current path. The second switching element may be turned-on by the first switching signal to define the second current path.

The first sensing electrode may be provided in plural, and the first line may be provided in plural. The plurality of first lines may be arranged to correspond one-to-one to the plurality of first sensing electrodes.

The plurality of first lines may be electrically connected to each other in the peripheral area.

The first sensing electrode may include first sensing portions arranged in the first direction and first intermediate portions disposed between adjacent sensing portions among the first sensing portions. The second sensing electrode may include second sensing portions arranged in the second direction and second intermediate portions disposed between adjacent sensing portions among the second sensing portions. The first sensing portions and the second sensing portions may be disposed above one insulation layer of the plurality of insulation layers. One intermediate portion, of the first and second intermediate portions, may be disposed above the one insulation layer, and other intermediate portions, of the first and second intermediate portions, may be disposed below the one insulation layer.

One line of the first line and the second line may have an integrated shape and be disposed above the one insulation layer. The other line of the first line and the second line may include an upper portion disposed above the one insulation layer and a lower portion disposed below the one insulation layer.

One intermediate portion of the other intermediate portions may be disposed in an area where the first sensing electrode crosses the second sensing electrode. The one intermediate portion may connect corresponding two first sensing portions among the first sensing portions or corresponding two second sensing portions among the second sensing portions.

An opening may be defined in the one line in an area wherein the first line crosses the second line. The lower portion may include a lower bridge portion disposed inside of the opening and first and second extension portions disposed outside of the opening. The lower bridge portion may be disposed between the first and second extension portions. The upper portion may include a first upper bridge portion connecting the lower bridge portion and the first extension portion to each other and a second upper bridge portion connecting the lower bridge portion and the second extension portion to each other.

The first upper bridge portion may overlap the one line and may be insulated from the one line.

An opening may be defined in the lower bridge portion. The one intermediate portion may be disposed inside of the opening of the lower bridge portion.

The first upper bridge portion may be at least partially surrounded by one first sensing portion among the first sensing portions, or the first upper bridge portion may be at least partially surrounded by one first sensing portion among the first sensing portions and one second sensing portion among the second sensing portions.

The first sensing electrode may be provided in plural, the first switching element may be provided in plural, the plurality of first switching elements may be arranged to correspond one-to-one with the plurality of first sensing electrodes, and the first line may overlap one first sensing electrode among the plurality of first sensing electrodes. Each of the plurality of first switching elements may be electrically connected to the first line.

The display device may further include a connection signal line disposed between the first line and a second terminal of the first sensing electrode, which is opposite to the first terminal of the first sensing electrode in the first direction. The first line and the connection signal line may be electrically connected to each other. The first line and the connection signal line may be disposed on different layers from each other.

The display device may further include a voltage line configured to receive a bias voltage. The first line may be disposed between the connection signal line and the first switching element, and the first switching element may be disposed between the first line and the voltage line.

The first line may be disposed between the connection signal line and the first switching element, and the first switching element may be disposed inside of a sensor control circuit.

The display device may further include a flexible circuit film electrically connected to the first signal line, the second signal line, the first line, and the second line. A main circuit board may be electrically connected to the flexible circuit film. The sensor control circuit may be disposed on the flexible circuit film or the main circuit board.

An electronic device includes a display panel. An input sensor is configured to sense a change of capacitance during a first mode and sense a change of current during a second mode. An electronic pen is configured to output an electromagnetic transmission signal. The display panel includes a base layer having an active area and a peripheral area disposed around the active area, a pixel transistor disposed on the base layer, and a light emitting element electrically connected to the pixel transistor. The input sensor includes a sensing electrode disposed on the active area. A signal line is electrically connected to a first terminal of the sensing electrode. A line overlaps the sensing electrode in the active area, extends in the same direction as the sensing electrode in the active area, and is configured to receive a bias voltage. A switching element is configured to switch an electrical connection between the sensing electrode and the line.

The electronic device may further include a connection signal line electrically connected to a second terminal opposite to the first terminal of the sensing electrode in an extension direction of the sensing electrode. The switching element may be disposed between the connection signal line and the line.

BRIEF DESCRIPTION OF THE FIGURES

A more complete appreciation of the present disclosure and many of the attendant aspects thereof will be readily

Figure 1A:
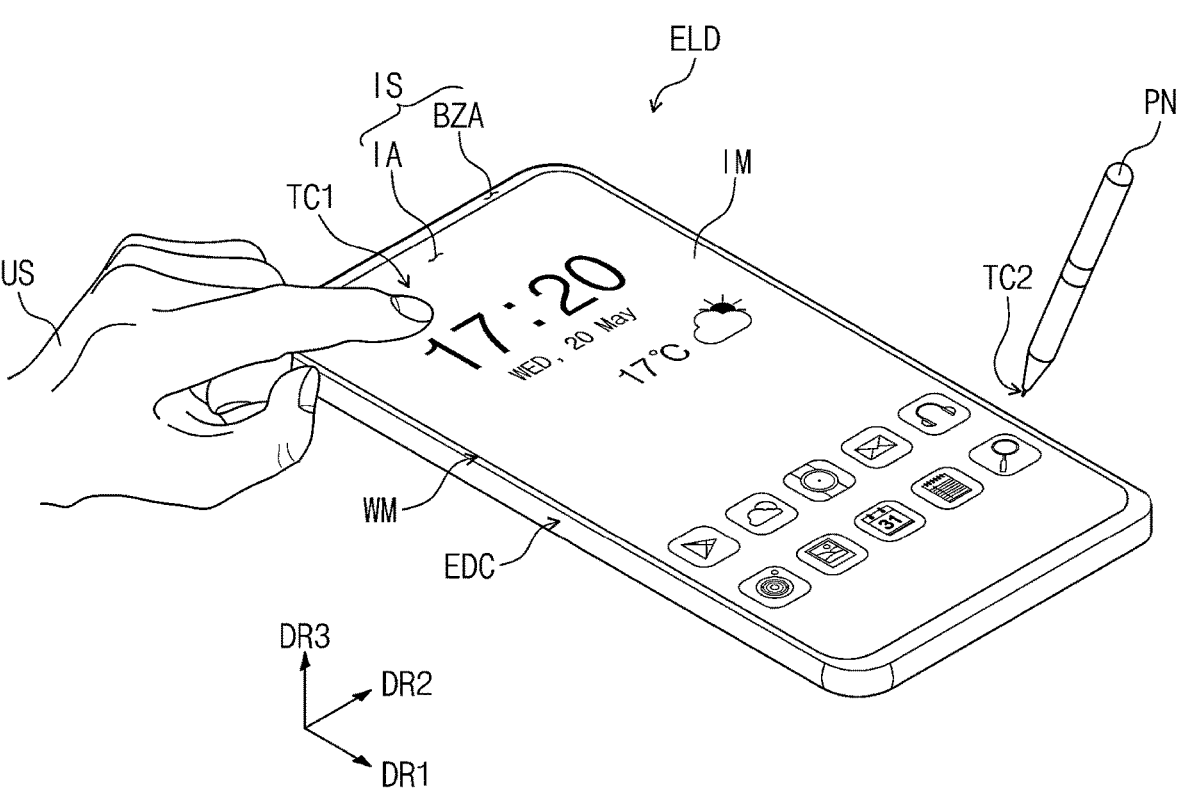
Figure 1B:
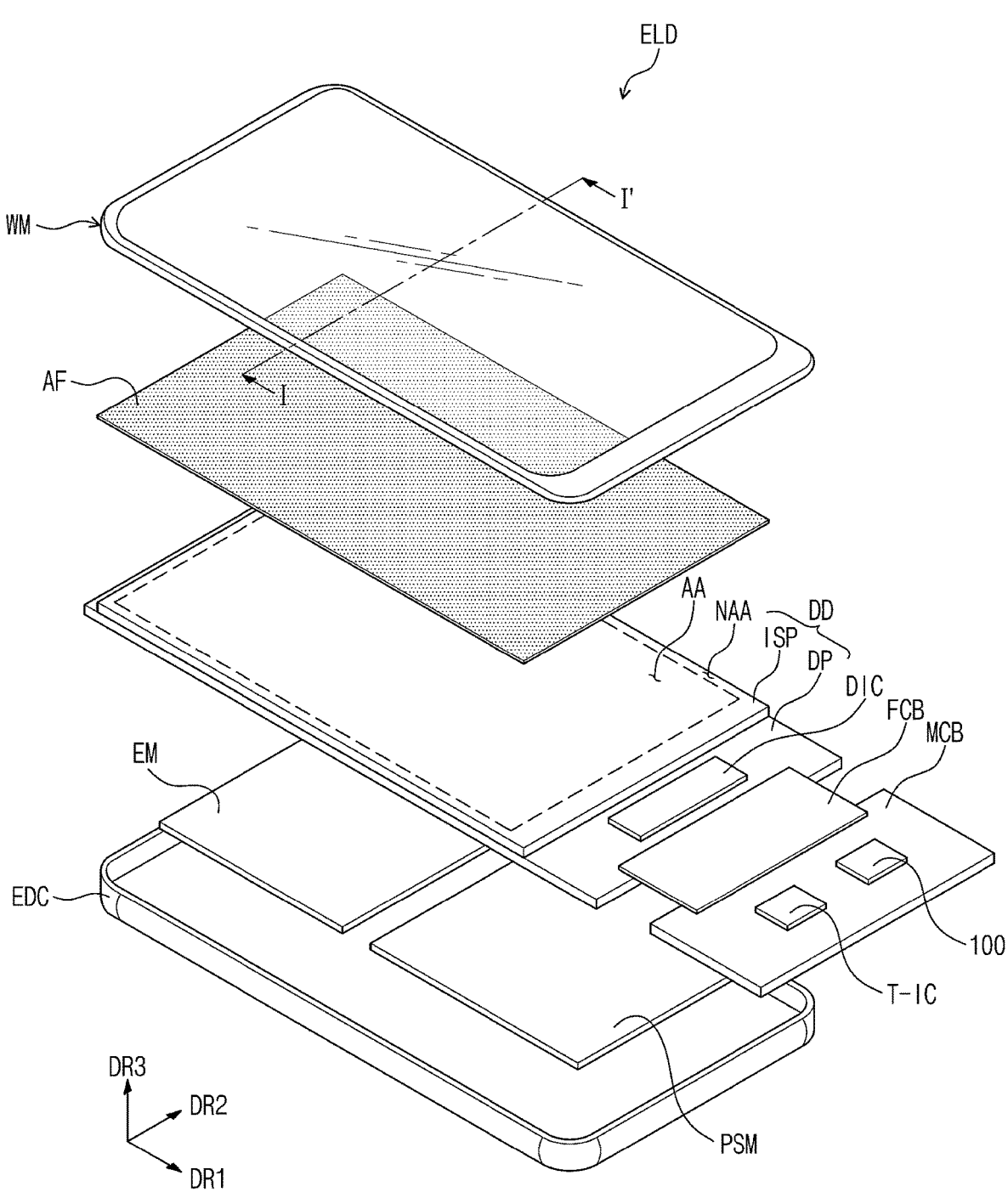
Figure 2A:
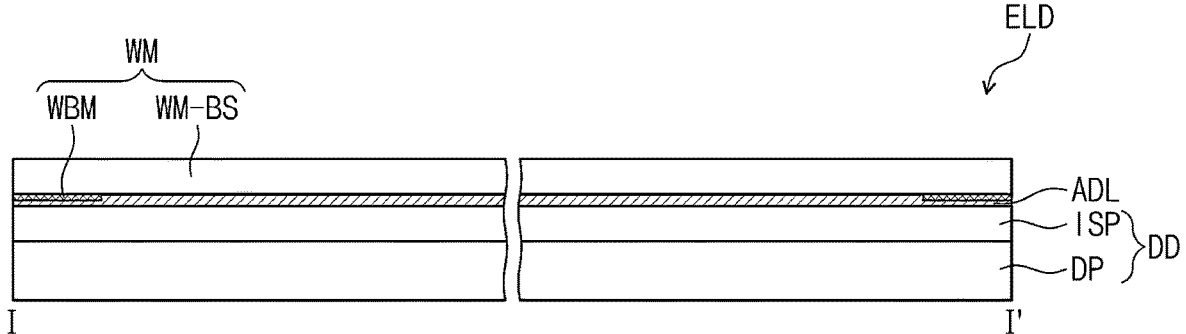
Figure 2B:
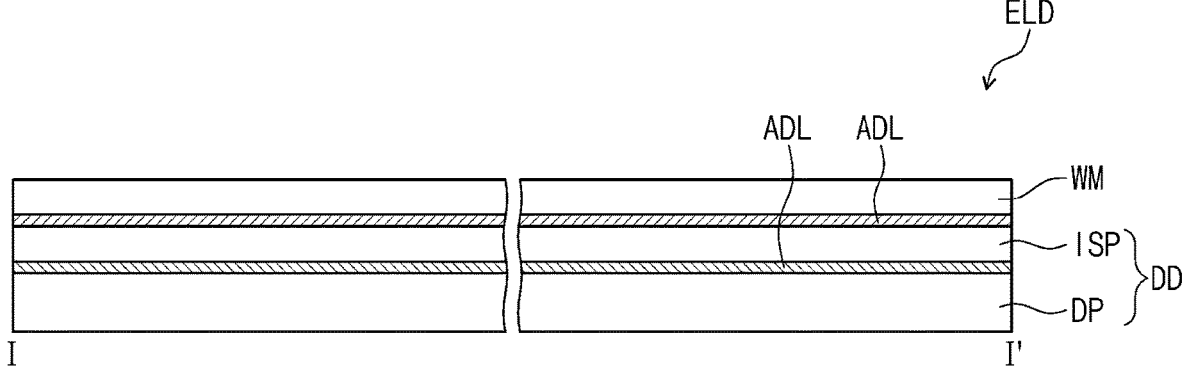
Figure 2C:
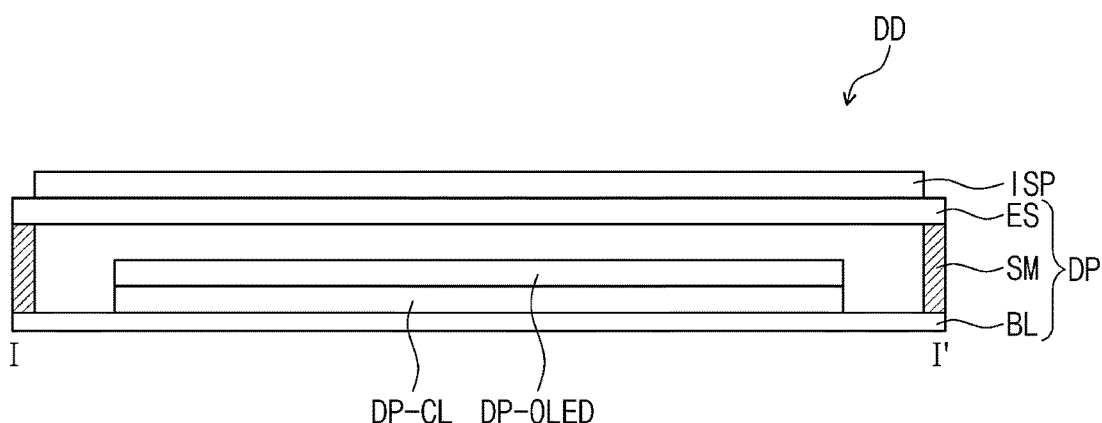
Figure 2D:
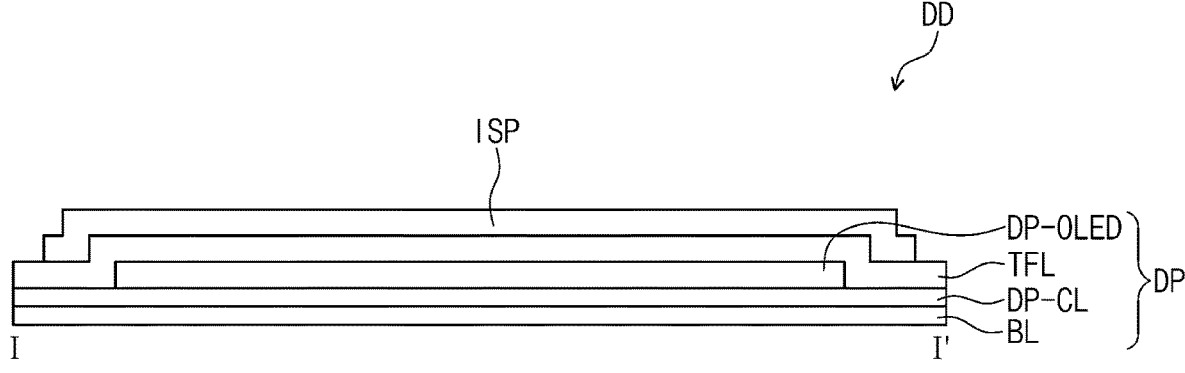
Figure 3A:
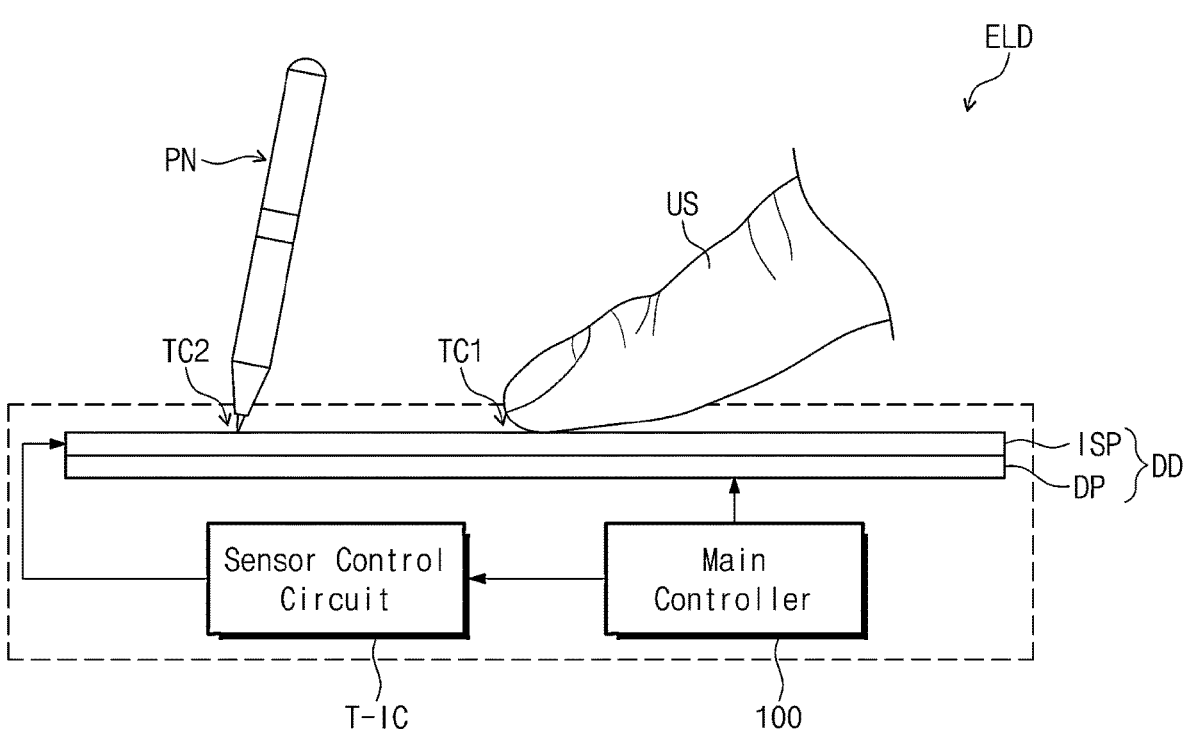
Figure 3B:
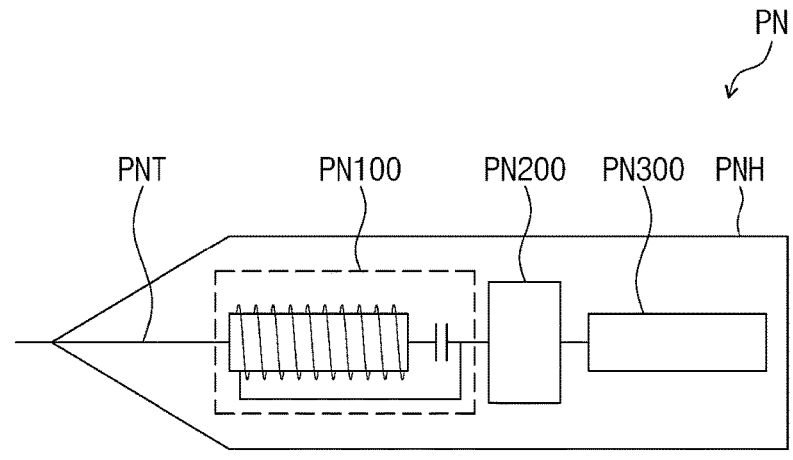
Figure 4:
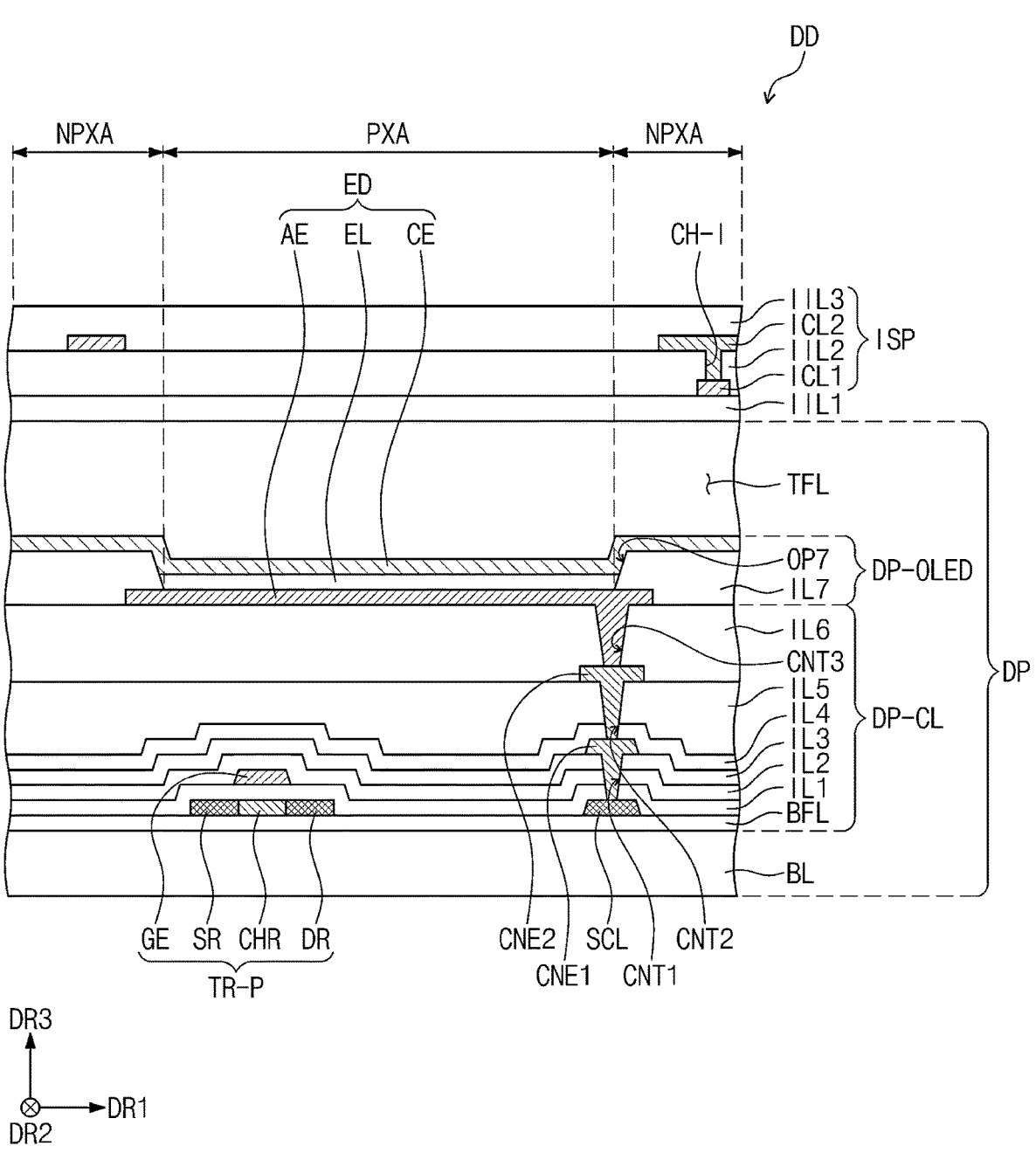
Figure 5A:
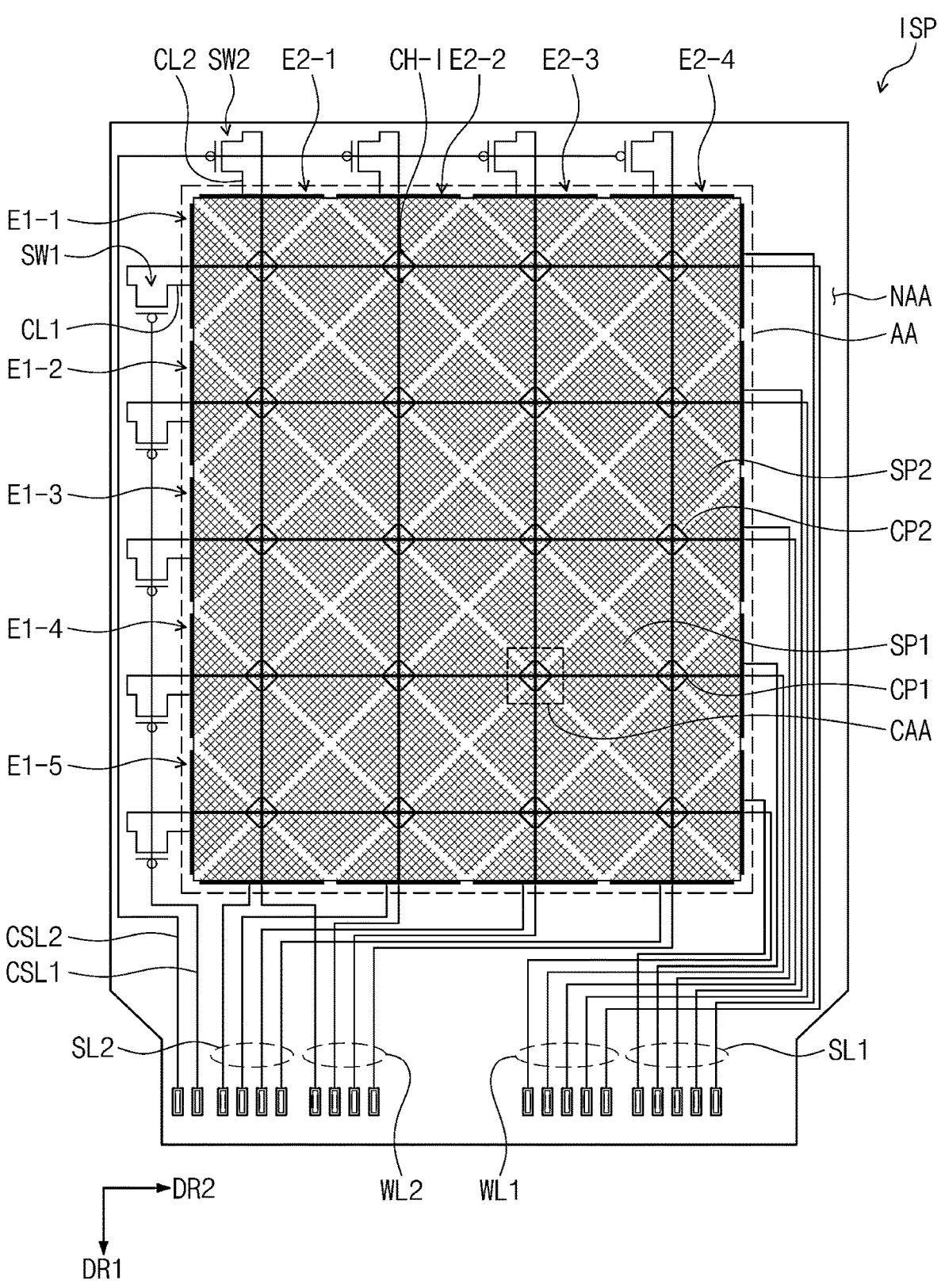
Figure 6:
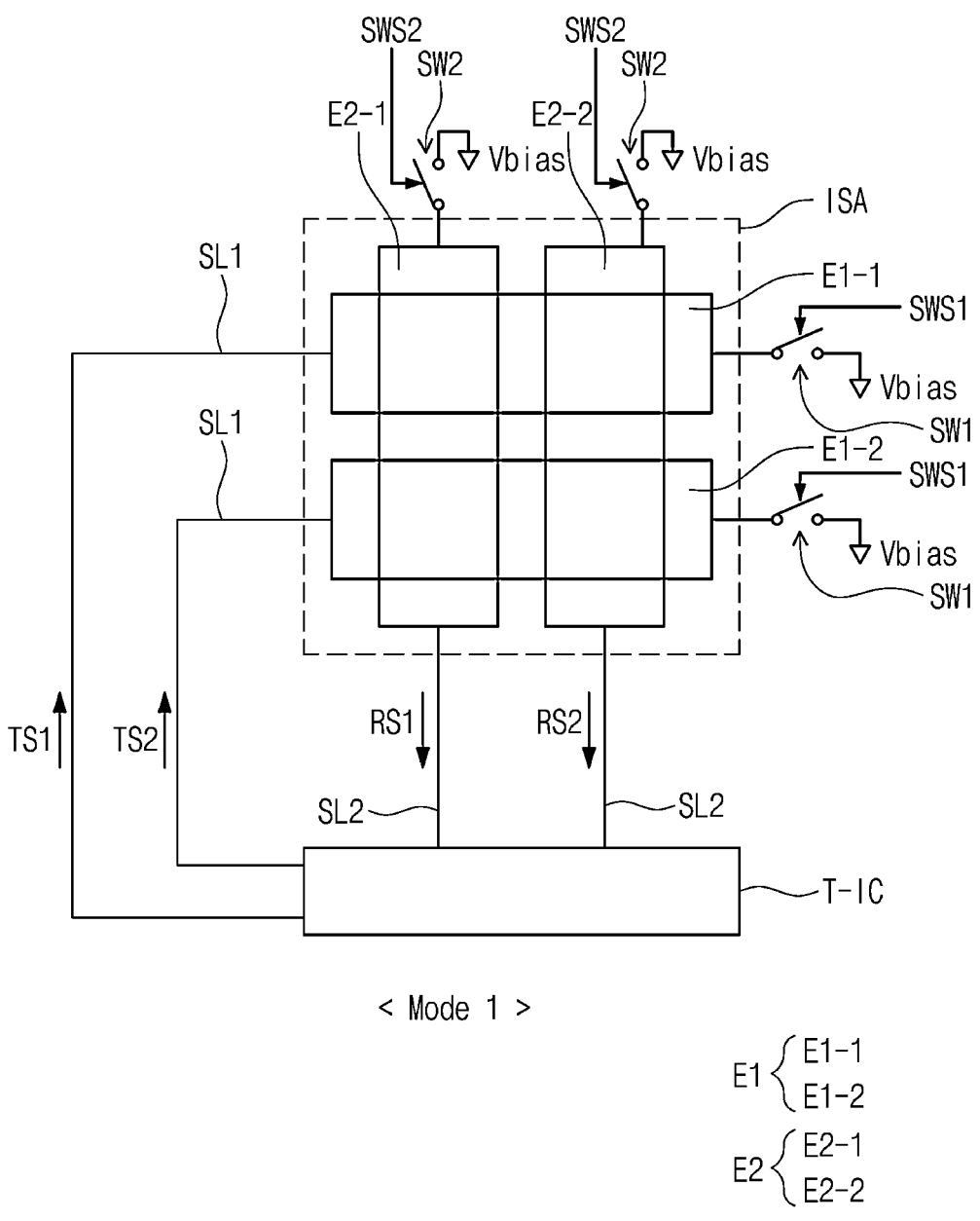
Figure 7:
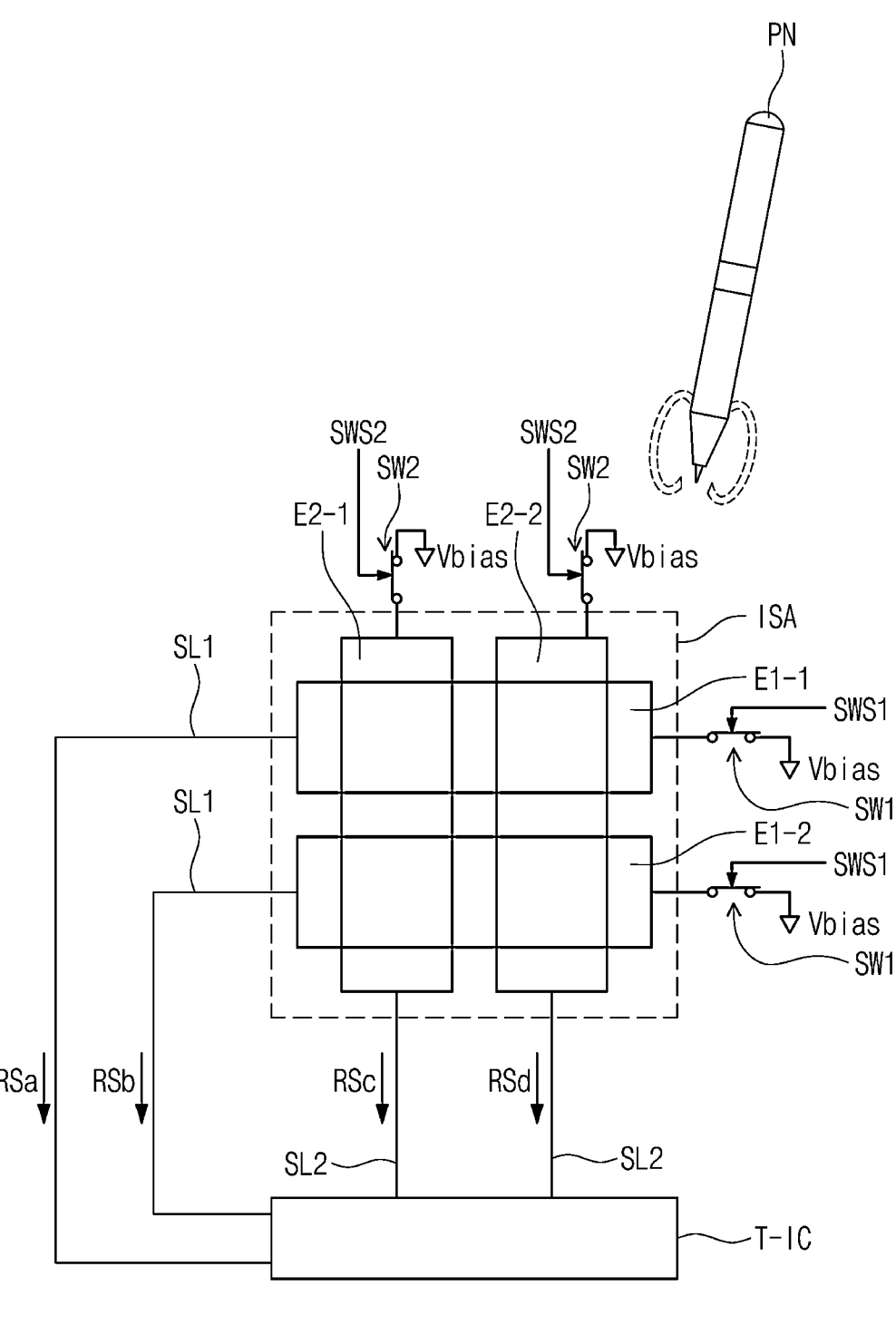
Figure 8A:
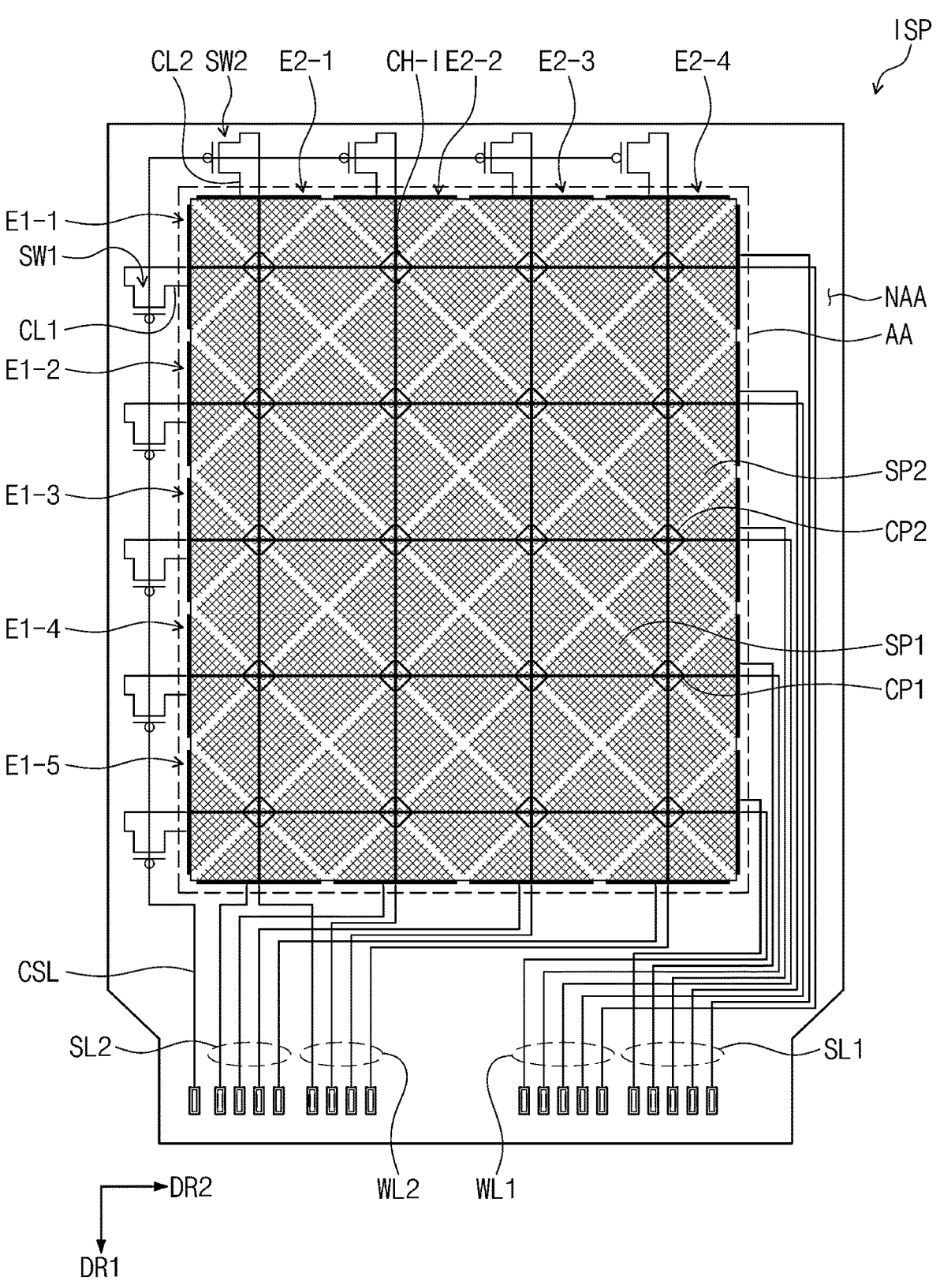
Figure 8B:
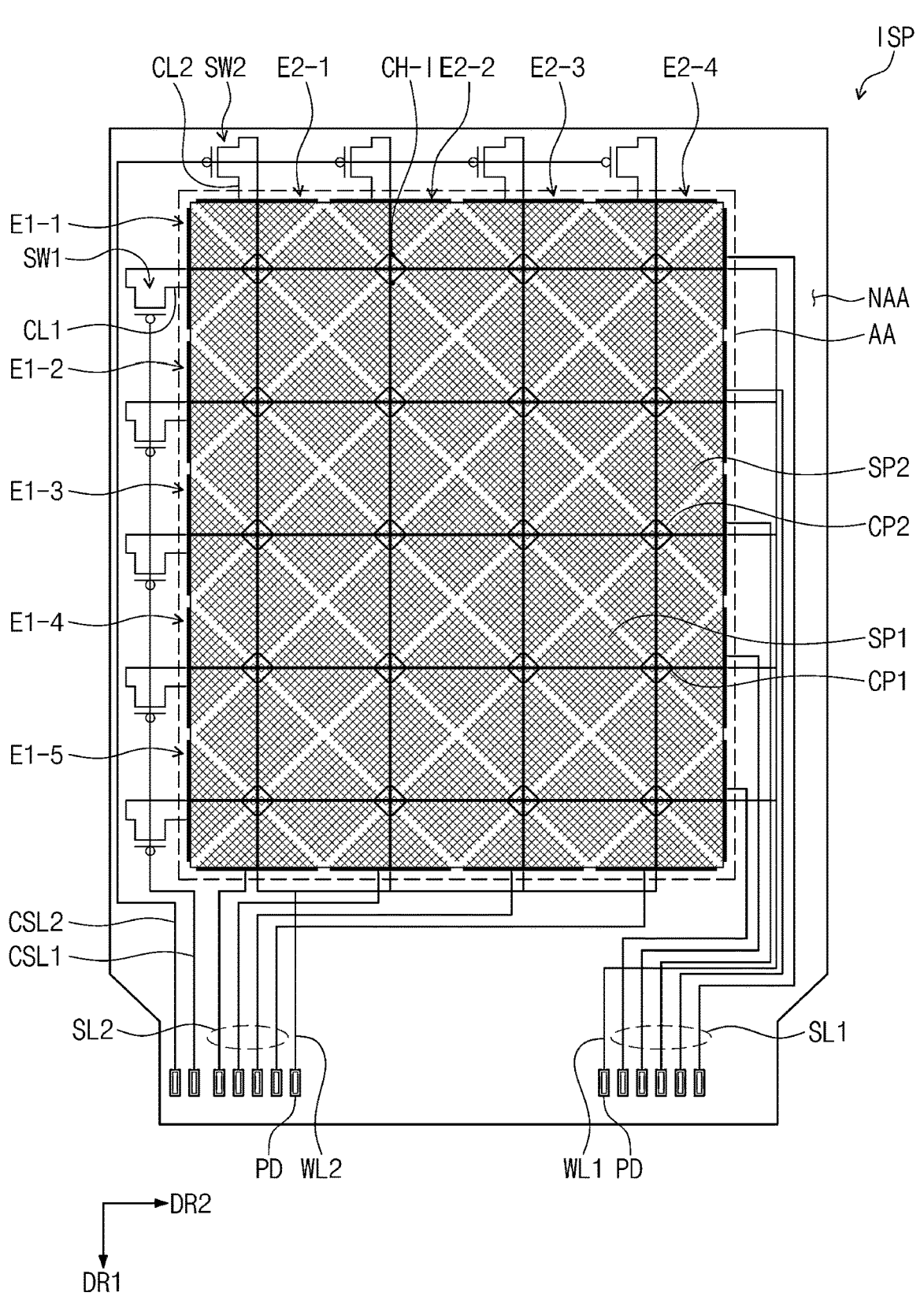
Figure 9B:
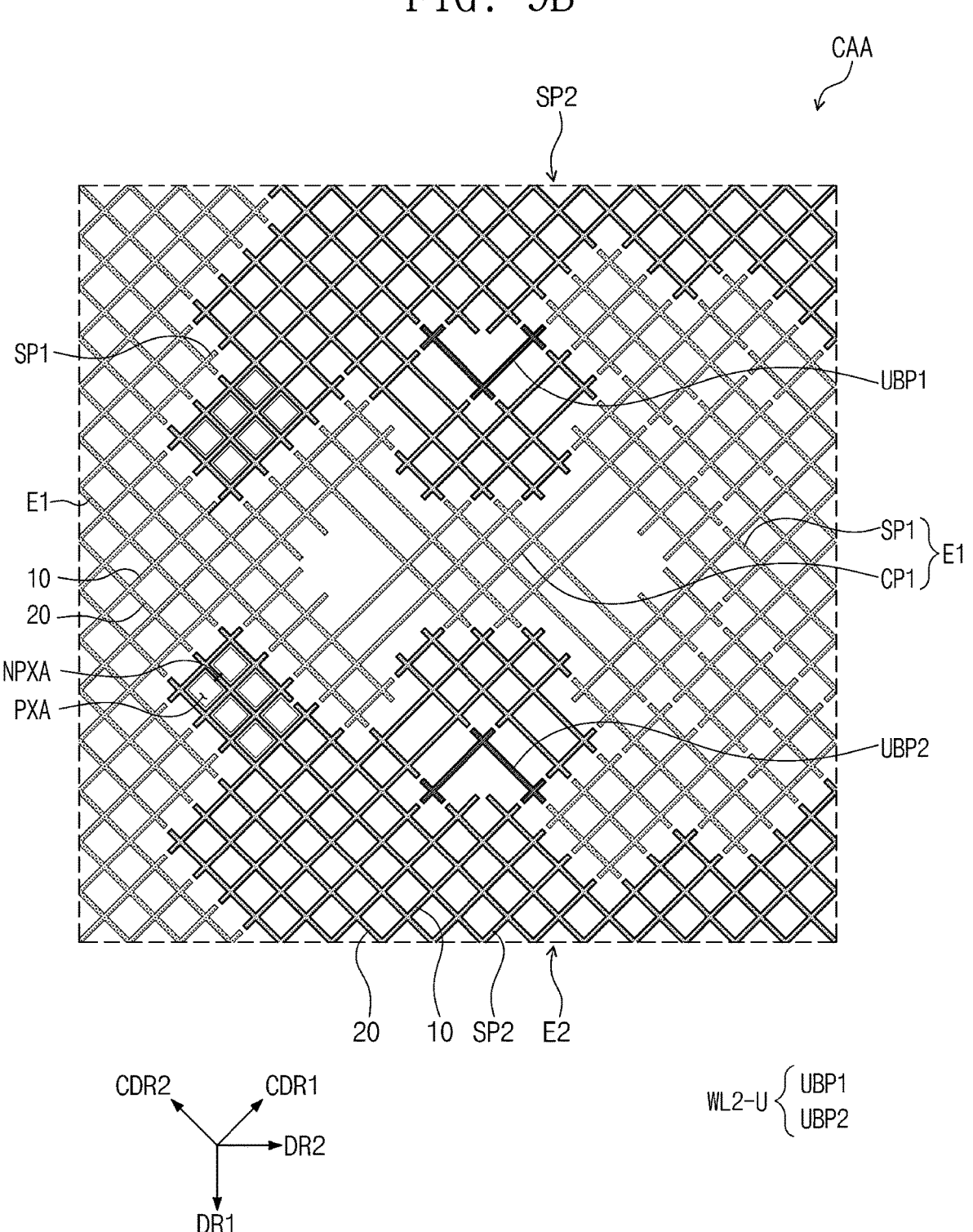
Figure 9C:
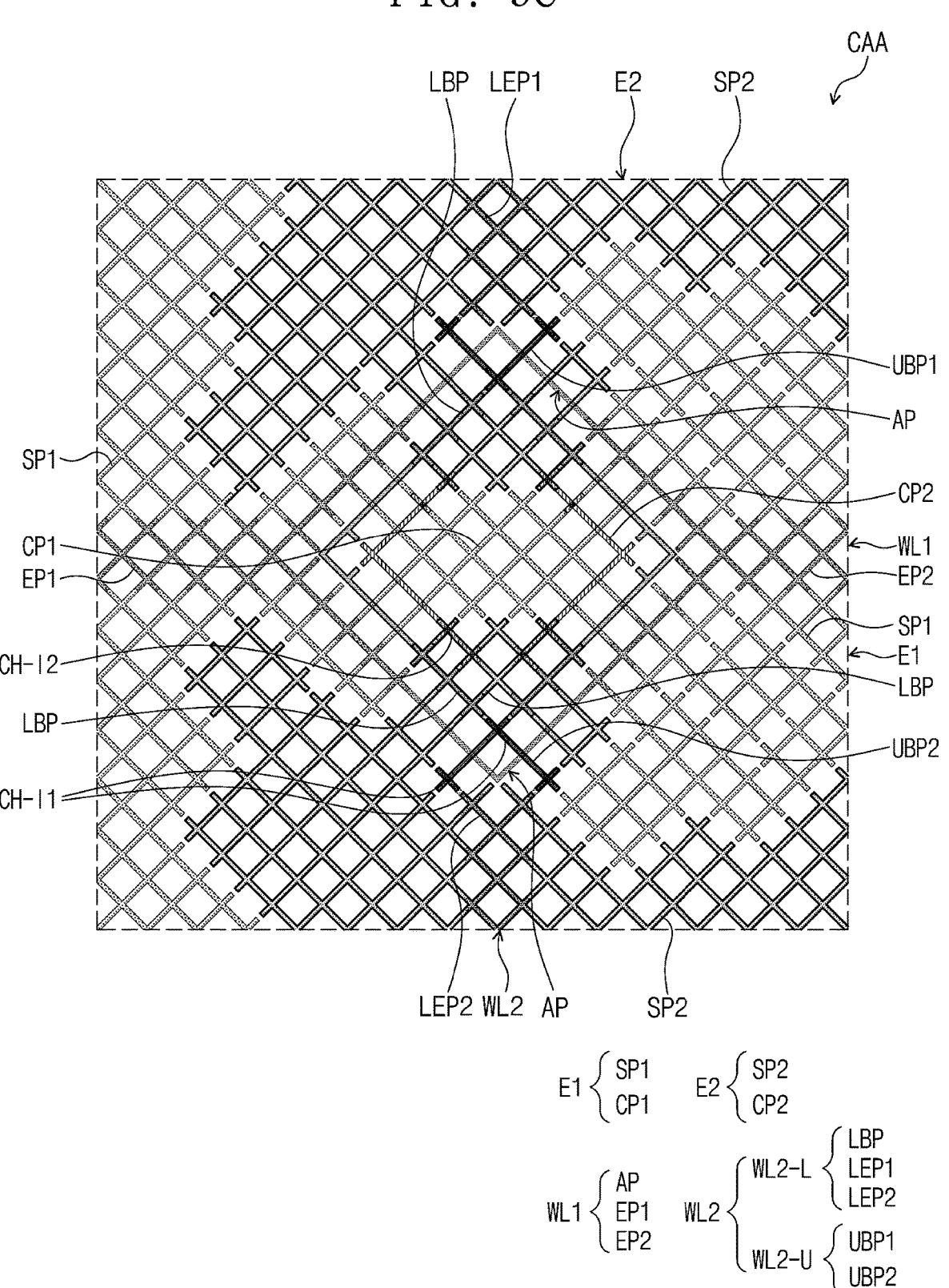
Figure 10:
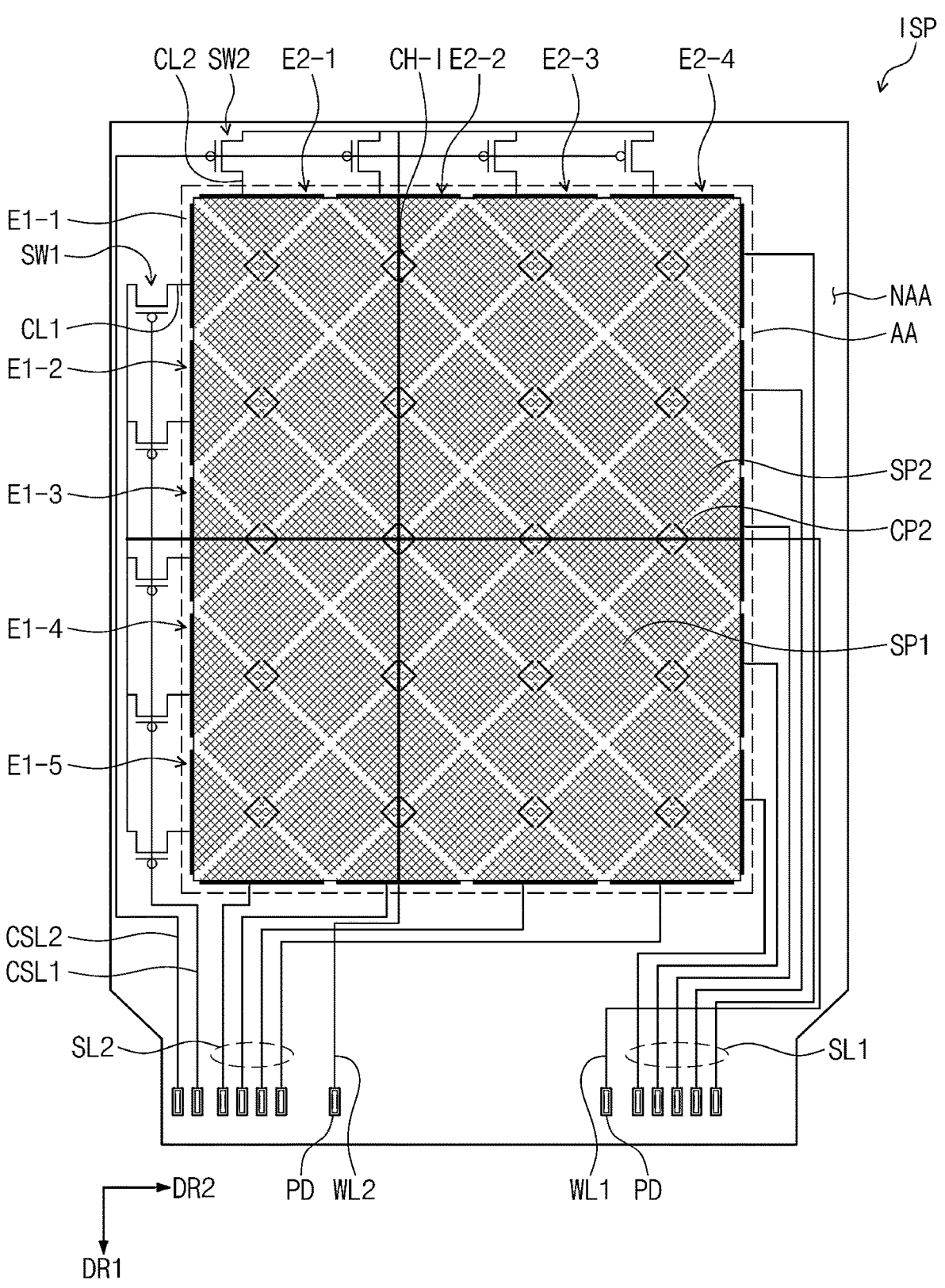
Figure 11:
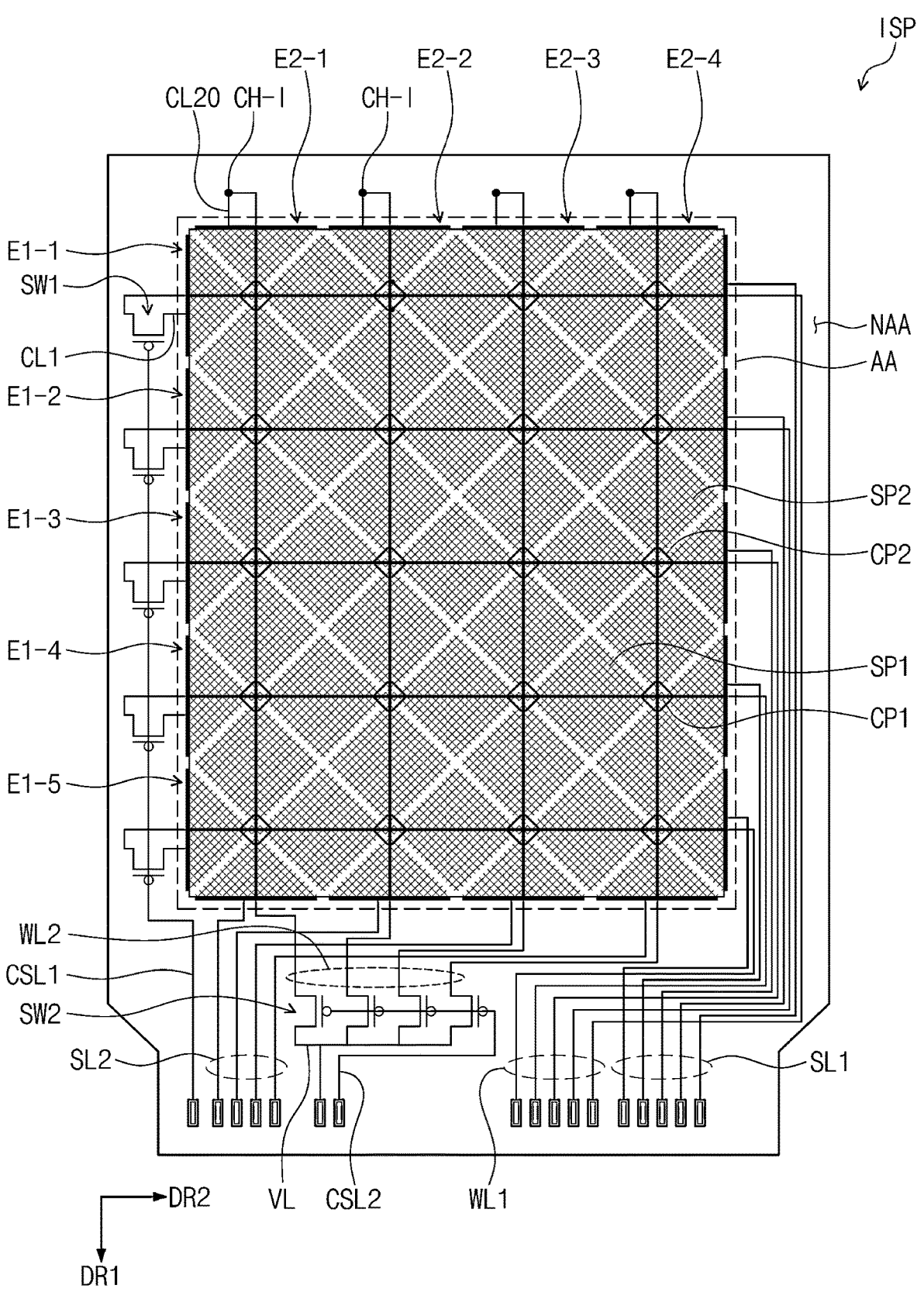
Figure 12:
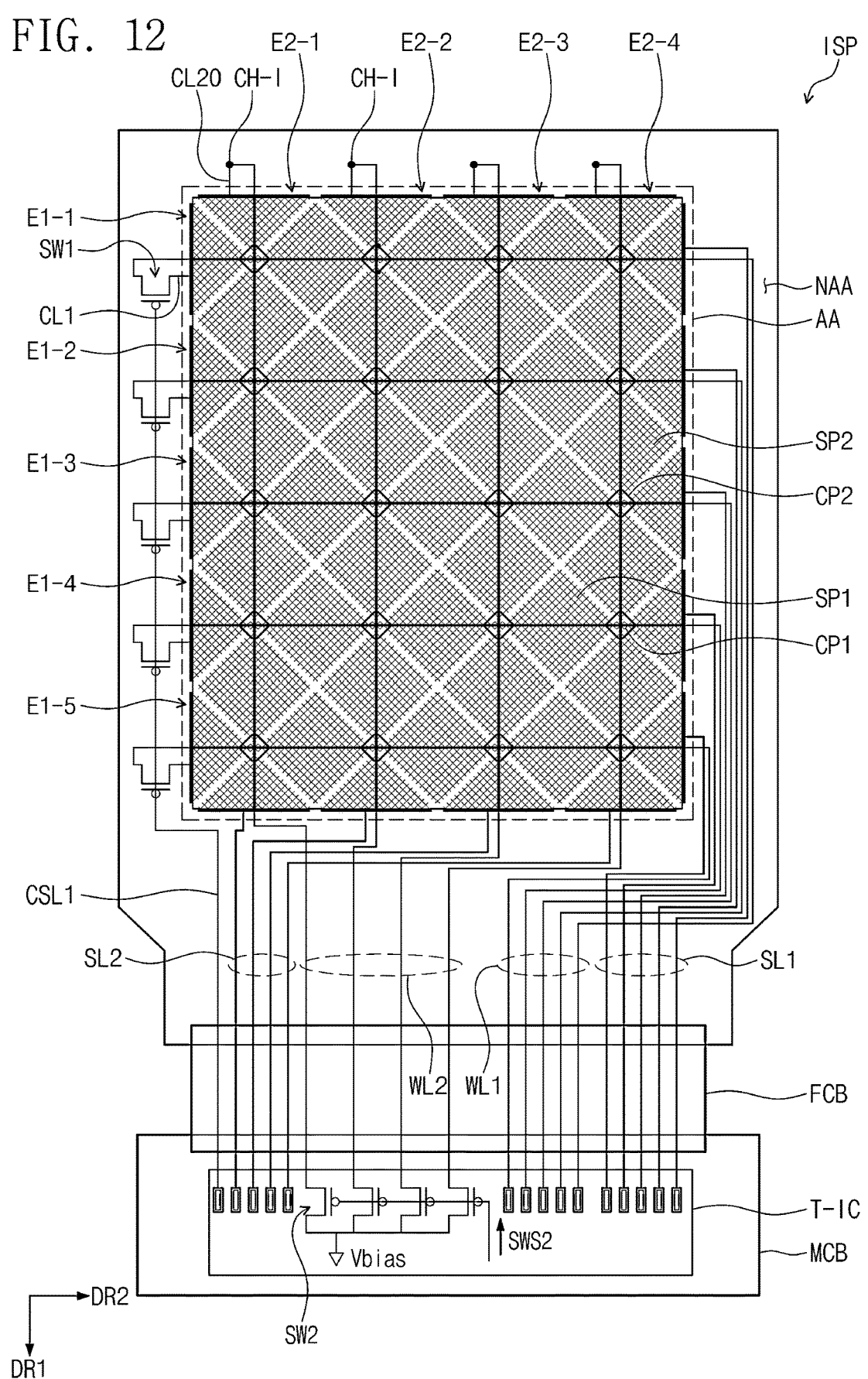

4 obtained as the same becomes better understood by reference to the following detailed description when considered in connection with the accompanying drawings, wherein:

FIG. 1A is a perspective view illustrating an electronic device according to an embodiment of the inventive concept;

FIG. 1B is an exploded perspective view illustrating the electronic device according to an embodiment of the inventive concept;

FIGS. 2A and 2B are cross-sectional views illustrating the electronic device and taken along line I-I' of FIG. 1B;

FIGS. 2C and 2D are cross-sectional views illustrating a display device, taken along line I-I' of FIG. 1B;

FIG. 3A is a block diagram for explaining an operation of the electronic device according to an embodiment of the inventive concept;

FIG. 3B is a block diagram illustrating an input device in FIG. 3A;

FIG. 4 is an enlarged cross-sectional view illustrating the display device according to an embodiment of the inventive concept;

Figure 5B:
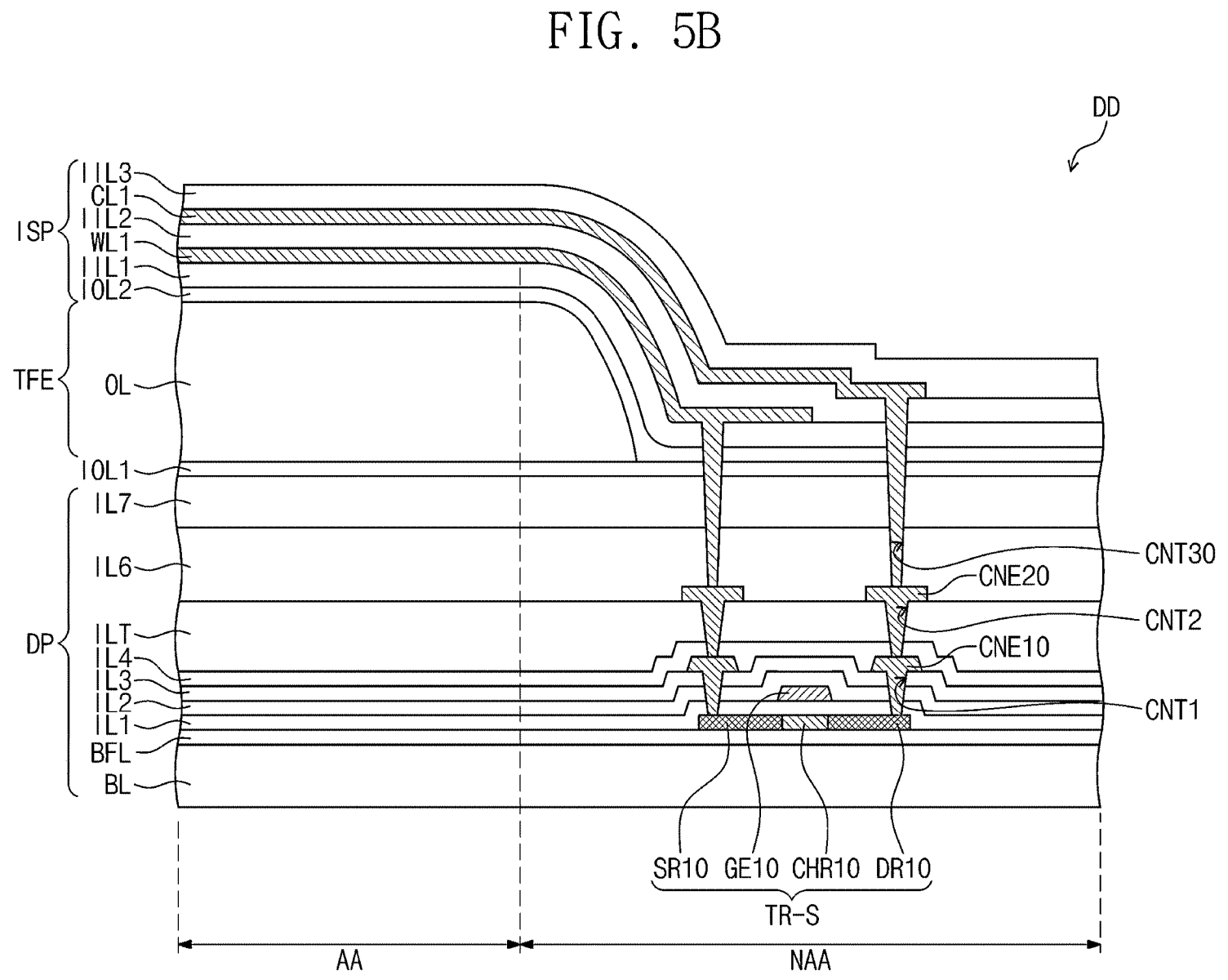

FIG. 5A is a plan view illustrating an input sensor according to an embodiment of the inventive concept;

FIG. 5B is an enlarged cross-sectional view illustrating the display device according to an embodiment of the inventive concept;

FIG. 6 is a diagram explaining a first mode of operation of the input sensor;

FIG. 7 is a diagram explaining a second mode of operation of the input sensor;

FIGS. 8A and 8B are plan views illustrating an input sensor according to an embodiment of the inventive concept;

Figure 9A:
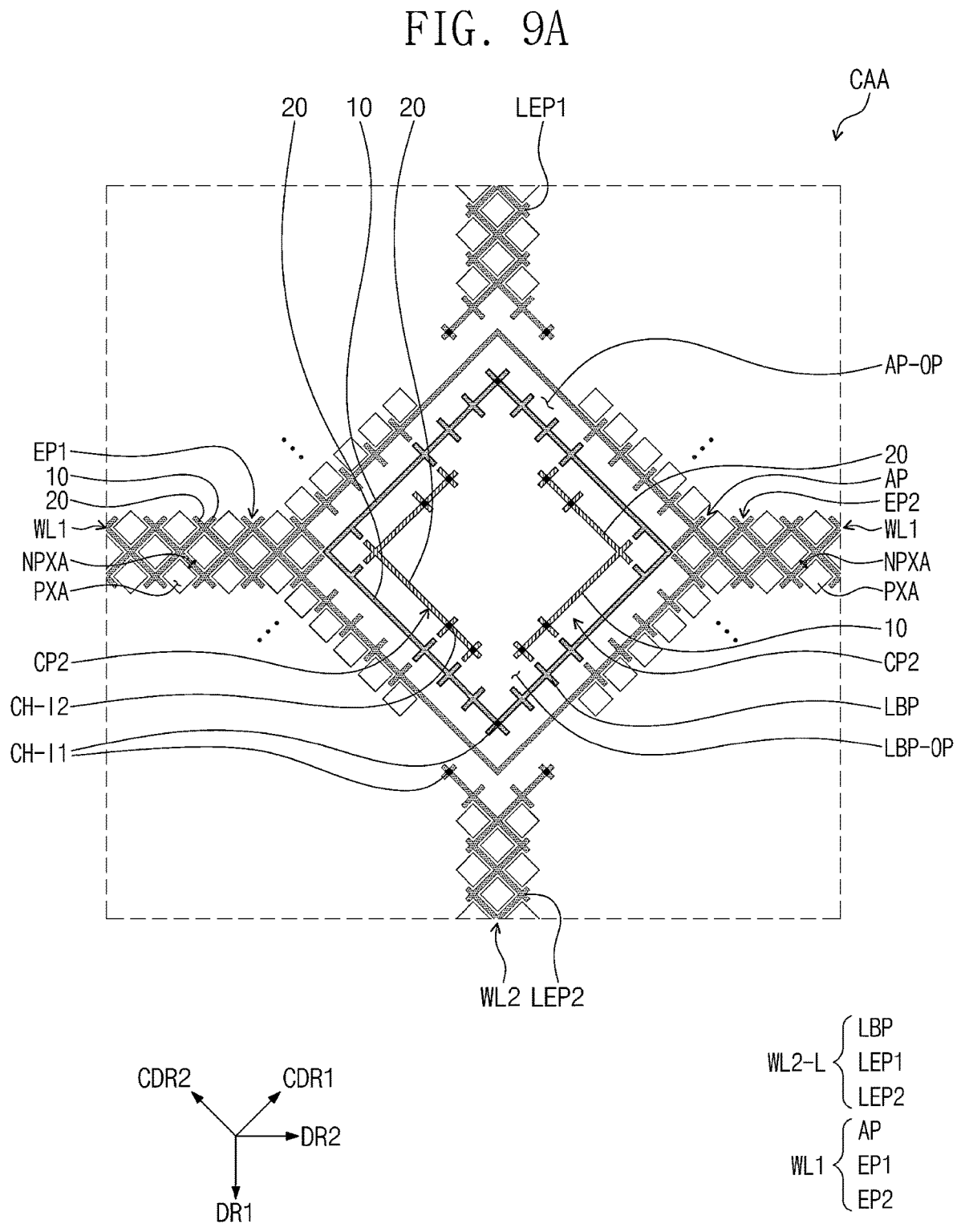

FIGS. 9A to 9C are enlarged plan view illustrating a crossing area of the input sensor; and FIGS. 10 to 12 are plan views illustrating an input sensor according to an embodiment of the inventive concept.

DETAILED DESCRIPTION

In this specification, it will be understood that when one component (or region, layer, portion) is referred to as being 'on', 'connected to', or 'coupled to' another component, it can be directly disposed/connected/coupled on/to the one component, or an intervening third component may also be present.

Like reference numerals may refer to like elements throughout the specification and the drawings. It is to be understood that in the figures, the relative thicknesses, ratios, angles, shapes, and other relative dimensions of the elements shown are intended to represent at least one embodiment of the disclosure, although the present discloser is not necessarily limited by the characteristics shown and other embodiments are certainly believed to be within the scope of the present disclosure. As used herein, the term and/or includes any and all combinations of one or more of the associated listed items.

It will be understood that although the terms such as 'first' and 'second' are used herein to describe various elements, these elements should not necessarily be limited by these terms. The terms are used to distinguish one component from other components. For example, a first element referred to as a first element in one embodiment can be referred to as a second element in another embodiment without departing from the scope of the present disclosure. The terms of a singular form may include plural forms unless referred to the contrary.

Also, spatially relative terms, such as "below", "lower", "above", and "upper", may be used herein for ease of description to describe an element and/or a feature's relationship to another element(s) and/or feature(s) as illustrated in the drawings. The terms may be a relative concept and described based on directions expressed in the drawings.

The meaning of 'include' or 'comprise' specifies a property, a fixed number, a step, an operation, an element, a component or a combination thereof, but does not exclude other properties, fixed numbers, steps, operations, elements, components or combinations thereof.

Hereinafter, embodiments of the inventive concept will be described with reference to the accompanying drawings.

FIG. 1A is a perspective view of an electronic device ELD according to an embodiment of the inventive concept, and FIG. 1B is an exploded perspective view of the electronic device ELD according to an embodiment of the inventive concept. FIGS. 2A and 2B are cross-sectional views illustrating the electronic device ELD and taken along line I-I' of FIG. 1B. FIGS. 2C and 2D are cross-sectional views illustrating a display device DD and taken along line I-I' of FIG. 1B.

Referring to FIGS. 1A to 1B, the electronic device ELD may be activated by an electrical signal. The electronic device ELD may be, e.g., a smartphone, a tablet computer, a notebook computer, a personal computer, and/or a smart television.

The electronic device ELD may display an image IM toward a third direction DR3 on a display surface IS that extends in a first direction DR1 and a second direction DR2. The display surface IS on which the image IM is displayed may correspond to a front surface of the electronic device ELD. The image IM may include a static image as well as a dynamic image.

In this embodiment, a front surface (e.g., a top surface) and a rear surface (e.g., a bottom surface) of each member described herein are defined based on a direction in which the image IM is displayed. The front surface and the rear surface may be opposite to each other in the third direction DR3, and a normal direction of each of the front surface and the rear surface may be parallel to the third direction DR3.

A spaced distance between the front surface and the rear surface in the third direction DR3 may correspond to a thickness of the electronic device ELD in the third direction DR3. However, directions indicated by the first to third directions DR1, DR2, and DR3 may be defined differently from those in FIG. 1A.

The electronic device ELD may sense an external input. The external input may include various types of inputs provided from the outside of the electronic device ELD. The electronic device ELD, according to this embodiment, may sense a first input TC1 applied from the outside. The first input TC1, as an input generated by a passive-type input unit, may include an input generated by a body of a user US and an input causing variation of a capacitance of an input sensor. The electronic device ELD may sense the first input TC1 of the user US applied to a side surface or a rear surface of the electronic device ELD according to a structure of the electronic device ELD. However, the embodiment of the inventive concept is not necessarily limited thereto.

Also, the electronic device ELD, according to an embodiment, may sense a second input TC2 having a different type from the first input TC1. The second input TC2 may be an input generated by an active-type input unit PN (or an EMR active pen). The input unit PN may provide an input signal of an electromagnetic field. The input signal of the electromagnetic field may change a flow of a current of the input sensor. The input sensor may sense the input signal of the electromagnetic field through an amount of change in the current.

The front surface of the electronic device ELD may include an image area IA and a bezel area BZA. The image area IA may be an area on which the image IM is displayed. The user may recognize the image IM through the image area IA. In this embodiment, the image area IA has a rectangular shape having rounded vertices. However, this is illustrative. The image area IA may have various shapes, and the embodiment of the inventive concept is not necessarily limited to any one embodiment.

The bezel area BZA is adjacent to the image area IA. The bezel area BZA may have a predetermined color. The bezel area BZA may at least partially surround the image area IA. Thus, the image area IA may have a shape that is substantially defined by the bezel area BZA. However, this is illustrative, and the bezel area BZA may be disposed adjacent to only one side of the image area IA or may be omitted. The electronic device ELD, according to an embodiment of the inventive concept, may include various embodiments and might not be limited to any one embodiment.

As illustrated in FIG. 1B, the electronic device ELD may include a display device DD, an optical member AF, a window WM, an electronic module EM, a power module PSM, and a case EDC. The display device DD generates an image and senses an external input. The display device DD may include a display panel DP and an input sensor ISP. The display device DD includes an active area AA and a peripheral area NAA corresponding to the image area IA (refer to FIG. 1A) and the bezel area BZA (refer to FIG. 1A) of the electronic device ELD.

However, the embodiment of the inventive concept is not necessarily limited to the display panel DP. For example, the display panel DP may include a light emitting display panel such as an organic light emitting display panel or an inorganic light emitting display panel. A detailed description on the input sensor ISP will be described later.

The display device DD may further include a main circuit board MCB, a flexible circuit film FCB, a driving circuit DIC, a sensor control circuit T-IC, and a main controller 100. At least one of the above-described component may be omitted. Each of the driving circuit DIC, the sensor control circuit T-IC, and the main controller 100 may be provided in the form of one or more integrated chips. The main circuit board MCB may be electrically connected to the display panel DP through the flexible circuit film FCB. The main circuit board MCB may include a plurality of driving elements. The main circuit board MCB may be electrically connected to the electronic module EM through a connector.

The flexible circuit film FCB may be electrically connected to the display panel DP to electrically connect the display panel DP with the main circuit board MCB. The display panel DP may be bent so that the flexible circuit film FCB and the main circuit board MCB face a rear surface of the display device DD.

Although the driving circuit DIC mounted to the display panel DP is illustrated as an example, the driving circuit DIC may be mounted to the flexible circuit film FCB. The driving circuit DIC may include driving elements for driving a pixel of the display panel DP, e.g., a data driving circuit.

The input sensor ISP may be electrically connected to the main circuit board MCB through an additional flexible circuit film. However, the embodiment of the inventive concept is not necessarily limited thereto. The input sensor ISP may be electrically connected to the display panel DP and electrically connected to the main circuit board MCB through the flexible circuit film FCB.

The optical member AF reduces a reflectance of external light. The optical member AF may include a polarizer and a retarder. Each of the polarizer and the retarder may be an elongation-type or a coating-type. The coating-type optical film has an optical axis defined along an elongated direction of a functional film. The coating-type optical film may include liquid crystal molecules arranged on a base film.

In an embodiment of the inventive concept, the optical member AF may be omitted. Here, the display device DD may further include a color filter and a black matrix to replace the optical member AF. The color filter and the black matrix may be disposed directly on a top surface of the input sensor ISP through a single continuous process. The top surface of the input sensor ISP provides an uppermost insulation layer of the input sensor ISP.

The window WM provides an outer surface of the electronic device ELD. The window WM may include a base substrate and may further include functional layers such as an anti-reflection layer and an anti-fingerprint layer.

The display device DD may further include at least one adhesive layer. The adhesive layer may couple adjacent components of the display device DD. The adhesive layer may be an optically clear adhesive layer or a pressure sensitive adhesive layer.

The electronic module EM includes at least a main controller. The electronic module EM may include a wireless communication module, an image input module, a sound input module, a sound output module, a memory, and an external interface module. The above-described modules may be mounted to a circuit board or electrically connected through a flexible circuit board. The electronic module EM may be electrically connected to the power module PSM.

The main controller controls an overall operation of the electronic device ELD. For example, the main controller activates or deactivates the display device DD in accordance with an input of the user. The main controller may control an operation of each of the display device DD, the wireless communication module, the image input module, the sound input module, and the sound output module. The main controller may include at least one microprocessor.

The case EDC may be coupled with the window WM. The case EDC adsorbs an impact applied from the outside and prevents foreign substances/moisture from permeating into the display device DD to protect components accommodated in the case EDC. In an embodiment of the inventive concept, the case EDC may be provided in the form in which a plurality of accommodation members are coupled.

Referring to FIG. 2A, the input sensor ISP may be disposed directly on the display panel DP. According to an embodiment of the inventive concept, the input sensor ISP may be provided on the display panel DP through a single continuous process. For example, when the input sensor ISP is disposed directly on the display panel DP, the adhesive layer might not be disposed between the input sensor ISP and the display panel DP. However, as illustrated in FIG. 2B, the adhesive layer ADL may be disposed between the input sensor ISP and the display panel DP. In this case, the input sensor ISP may be manufactured through a process separated from the display panel DP and then fixed to a top surface of the display panel DP by the adhesive layer instead of being manufactured by a single continuous process with the display panel DP. In the arrangement shown in FIGS. 2A and 2B, the optical member AF in FIG. 1B may be present. Also, component disposed below the display device DD may be present.

As illustrated in FIG. 2A, the window WM may include a light shielding pattern WBM for defining the bezel area BZA (refer to FIG. 1A). The light shielding pattern WBM may be a colored organic layer and may be provided on one surface of a base layer WM-BS by, e.g., a coating method.

As illustrated in FIG. 2C, the display panel DP includes a base layer BL, a circuit element layer DP-CL disposed on the base layer BL, a display element layer DP-OLED, an encapsulation substrate EC, and a sealant SM for coupling the base layer BL and the encapsulation substrate EC.

The base layer BL may include at least one plastic film. The base layer BL may include a plastic substrate, a glass substrate, a metal substrate, and an organic/inorganic composite substrate. In this embodiment, the base layer BL may be a thin film glass substrate having a thickness of several tens to several hundreds of microns ($\mu$m). The base layer BL may have a multilayer structure. For example, the base layer BL may have a multilayer structure including an organic layer (e.g., a polyimide layer), at least one inorganic layer, and an organic layer (e.g., a polyimide layer).

The circuit element layer DP-CL includes at least one insulation layer and a circuit element. The insulation layer includes at least one inorganic layer and at least one organic layer. The circuit element includes signal lines and a pixel circuit. A detailed description thereof will be described later.

The display element layer DP-OLED includes at least a light emitting element. The display element layer DP-OLED may further include an organic layer such as a pixel defining layer.

The encapsulation substrate EC may be spaced a predetermined gap GP from the display element layer DP-OLED. Each of the base layer BL and the encapsulation substrate EC may include a plastic substrate, a glass substrate, a metal substrate, or an organic/inorganic composite substrate. The sealant SM may include an organic adhesive or frit. A predetermined material may be filled in the gap GP. A moisture absorbent or a resin material may be filled in the gap GP.

As illustrated in FIG. 2D, the display panel DP includes a base layer BL, a circuit element layer DP-CL disposed on the base layer BL, a display element layer DP-OLED, and an upper insulation layer TFL. The upper insulation layer TFL includes a plurality of thin-films. The upper insulation layer TFL may include a protection layer for protecting a light emitting element. The upper insulation layer TFL may include a thin-film encapsulation layer including at least an inorganic layer/an organic layer/an inorganic layer. The thin-film encapsulation layer may be disposed on the protection layer.

FIG. 3A is a block diagram for explaining an operation of the electronic device ELD according to an embodiment of the inventive concept, and FIG. 3B is a block diagram of an input unit PN in FIG. 3A.

Referring to FIGS. 3A and 3B, the electronic device ELD, according to an embodiment of the inventive concept, may include the main controller 100 for controlling a driving of the display device DD and the sensor control circuit T-IC for controlling an operation of the input sensor ISP. The main controller 100 may control an operation of each of the driving circuit DIC (refer to FIG. 1B) and the sensor control circuit T-IC. In an embodiment of the inventive concept, the main controller 100 and the sensor control circuit T-IC may be mounted to the main circuit board MCB (refer to FIG. 1B). In an embodiment of the inventive concept, the sensor control circuit T-IC may be integrated to the driving circuit DIC (refer to FIG. 1B). The sensor control circuit T-IC may be integrated to the main controller 100.

The input sensor ISP may include sensing electrodes. The sensing electrodes may include first sensing electrodes and second sensing electrodes. A detailed description on the input sensor ISP will be described later.

The sensor control circuit T-IC may be electrically connected to the sensing electrodes of the input sensor ISP. The control circuit T-IC may operate the input sensor ISP in a first mode to sense the first input TC1 (refer to FIG. 1A) and operate the input sensor ISP in a second mode to sense the second input TC2 (refer to FIG. 1A). The first mode and the second mode may be alternately performed or performed in different sections by a predetermined method.

As illustrated in FIG. 3B, the input unit PN may include a housing PNH, a pen tip PNT, a resonant circuit part PN100, a signal generation part PN200, and a power part PN300.

The housing PNH may have a pen shape and may define an accommodation space. The resonant circuit part PN100, the signal generation part PN200, and the power part PN300 may be disposed in the accommodation space defined in the housing PNH. The pen tip PNT may be disposed at an end of the housing PNH. For example, the pen tip PNT may have one portion exposed to the outside of the housing PNH and the rest of the pen tip PNT may be inserted into the housing PNH.

The resonant circuit part PN100 may be a resonant circuit including an inductor and a capacitor. The capacitor may store a current caused by a transmission signal (or a Tx signal) as an electric field, and the inductor may store the current caused by the transmission signal as a magnetic field. The inductor may include a magnetic body and a coil wound around the magnetic body.

The signal generation part PN200 may generate the transmission signal. The signal generation part PN200 may include an integrated circuit or an oscillator having a specific purpose. The signal generation part PN200 may output an alternating current signal having a frequency of a predetermined value. For example, the transmission signal generated from the signal generation part PN200 may be a signal having a fixed frequency, and the transmission signal may be a sine wave having a frequency of about 560 kHz. However, the embodiment of the inventive concept is not necessarily limited thereto.

The resonant circuit part PN100 may be charged by the signal generation part PN200. Thus, the signal generation part PN200 may stop signal transmission after charging the resonant circuit part PN100. An induced current may be generated in the resonant circuit part PN100 by the transmission signal, and the resonant circuit part PN100 may be resonated by the induced current and output the transmission signal of the electromagnetic field. The transmission signal may be an input signal of the electromagnetic field generating the second input TC2 of the input sensor ISP (refer to FIG. 3A).

The power part PN300 may supply a power to the signal generation part PN200. The power part PN300 may include a battery or a high capacity capacitor.

FIG. 4 is a cross-sectional view illustrating the display device DD according to an embodiment of the inventive concept. FIG. 4 is illustrated based on the display device DD of FIG. 2D.

Referring to FIG. 4, the display device DD may include the display panel DP and the input sensor ISP disposed directly on the display panel DP. The display panel DP may include the base layer BL, the circuit element layer DP-CL, the display element layer DP-OLED, and the upper insulation layer TFL.

Each of the display panel DP and the input sensor ISP may include the active area AA and the peripheral area NAA described with reference to FIG. 1B. FIG. 4 is an enlarged view illustrating a portion of the active area AA.

The base layer BL may provide a base surface on which the circuit element layer DP-CL is disposed. The circuit element layer DP-CL may be disposed on the base layer BL. The circuit element layer DP-CL may include an insulation layer, a semiconductor pattern, a conductive pattern, and a signal line. An insulation layer, a semiconductor layer, and a conductive layer may be provided on the base layer BL by a method such as coating and deposition, and then the insulation layer, the semiconductor layer, and the conductive layer may be selectively patterned through a plurality of photolithography processes. Thereafter, the semiconductor pattern, the conductive pattern and the signal line, which are contained in the circuit element layer DP-CL, may be provided.

At least one inorganic layer is provided on a top surface of the base layer BL. In this embodiment, the display panel DP includes a buffer layer BFL. The buffer layer BFL may increase a coupling force between the base layer BL and the semiconductor pattern. The buffer layer BFL may include a silicon oxide layer and a silicon nitride layer, and the silicon oxide layer and the silicon nitride layer may be alternately laminated with each other.

The semiconductor pattern may be disposed on the buffer layer BFL. The semiconductor pattern may include poly-silicon. However, the embodiment of the inventive concept is not necessarily limited thereto. For example, the semiconductor pattern may include amorphous silicon or a metal oxide.

FIG. 4 illustrates a portion of the semiconductor pattern, and the semiconductor pattern may be further disposed in other areas. The semiconductor pattern may be arranged over pixels according to a particular rule. The semiconductor pattern may have an electrical property that is varied according to doping. The semiconductor pattern may include a first area having a relatively high conductivity and a second area having a relatively low conductivity. The first area may be doped with an n-type dopant or a p-type dopant. A p-type transistor includes a doped area that is doped with the p-type dopant. The second area may be an undoped area or a doped area having a concentration less than that of the first area.

The first area has conductivity that is greater than that of the second area and substantially serves as an electrode or a signal line. The second area may substantially correspond to an active region (or channel region) of a pixel transistor TR-P. For example, a portion of the semiconductor pattern may be the active region of the transistor, and another portion may be a source region or a drain region of the transistor.

Each of the pixels may have an equivalent circuit including seven transistors, one capacitor, and a light emitting element, and the equivalent circuit of the pixel may be deformed into various shapes. In FIG. 4, one pixel transistor TR-P and a light emitting element ED contained in the pixel are illustrated as an example.

A source region SR, a channel region CHR, and a drain region DR of the pixel transistor TR-P may be provided from the semiconductor pattern. The source region SR and the drain region DR may extend in opposite directions from the channel region CHR on a cross-section. In FIG. 4, a portion of a signal transmission region SCL provided in the first area of the semiconductor pattern is illustrated. The signal transmission region SCL may be electrically connected to the pixel transistor TR-P on a plane.

A first insulation layer IL1 may be disposed on the buffer layer BFL. The first insulation layer IL1 may overlap the plurality of pixels in common and cover the semiconductor pattern. The first insulation layer IL1 may be an inorganic layer and/or an organic layer and have a single-layer or multi-layer structure. The first insulation layer IL1 may include an aluminum oxide, a titanium oxide, a silicon oxide, a silicon nitride, a silicon oxynitride, a zirconium oxide, and/or a hafnium oxide. For example, the first insulation layer IL1 may be a single-layered silicon oxide layer. An insulation layer of the circuit element layer DP-CL, which will be described later, may be an inorganic layer and/or an organic layer in addition to the first insulation layer IL1 and have a single-layer or multi-layer structure. Although the inorganic layer may include at least one of the above-described materials, the embodiment of the inventive concept is not necessarily limited thereto.

A gate GE of the pixel transistor TR-P may be disposed on the first insulation layer IL1. The gate GE may be a portion of a metal pattern. The gate GE may overlap the channel region CHR. The gate GE may serve as a mask in a process of doping the semiconductor pattern.

A second insulation layer IL2 may be disposed on the first insulation layer IL1 and may cover the gate G1. The second insulation layer IL2 may overlap the pixels in common. The second insulation layer IL2 may be an inorganic layer and/or an organic layer and have a single-layer or multi-layer structure. In this embodiment, the second insulation layer IL2 may be a single-layered silicon oxide layer.

A third insulation layer IL3 may be disposed on the second insulation layer IL2. In this embodiment, the third insulation layer IL3 may be a single-layered silicon oxide layer. A first connection electrode CNE1 may be disposed on the third insulation layer IL3. The first connection electrode CNE1 may be electrically connected to the signal transmission region SCL through a contact hole CNT1 passing through the first, second, and third insulation layers IL1, IL2, and IL3.

A fourth insulation layer IL4 may be disposed on the third insulation layer IL3. The fourth insulation layer IL4 may be a single-layered silicon oxide layer. A fifth insulation layer IL5 may be disposed on the fourth insulation layer IL4. The fifth insulation layer IL5 may be an organic layer.

A second connection electrode CNE2 may be disposed on the fifth insulation layer IL5. The second connection electrode CNE2 may be electrically connected to the first connection electrode CNE1 through a contact hole CNT-2 passing through the fourth and fifth insulation layers IL4 and IL5.

A sixth insulation layer IL6 may be disposed on the fifth insulation layer IL5 and may cover the second connection electrode CNE2. The sixth insulation layer IL6 may be an organic layer. The display element layer DP-OLED may be disposed on the circuit element layer DP-CL. The display element layer DP-OLED may include the light emitting element ED. The light emitting element ED may include a first electrode AE, a light emitting layer EL, and a second electrode CE. For example, the light emitting layer EL may include an organic light emitting material, a quantum dot, a quantum rod, a micro-LED, or a nano-LED.

The first electrode AE may be disposed on the sixth insulation layer IL6. The first electrode AE may be electrically connected to the second connection electrode CNE2 through a contact hole CNT3 passing through the sixth insulation layer IL6.

A pixel defining layer IL7 may be disposed on the sixth insulation layer IL6 and may cover a portion of the first electrode AE. An opening OP7 is defined in the pixel defining layer IL7. The opening OP7 of the pixel defining layer IL7 exposes at least a portion of the first electrode AE. In this embodiment, a light emitting area PXA may be defined in correspondence to a portion of the first electrode AE exposed by the opening OP7. A non-light emitting area NPXA may at least partially surround the light emitting area PXA.

The light emitting layer EL may be disposed on the first electrode AE. The light emitting layer EL may be disposed in correspondence to the opening OP7. For example, the light emitting layer EL may be separately provided in each of the pixels. When the light emitting layer EL is separately provided in each of the pixels, each of the light emitting layers EL may emit light having at least one color of blue, red, and green. However, the embodiment of the inventive concept is not necessarily limited thereto. For example, the light emitting layer EL may be electrically connected to the pixels and provided in common. In this case, the light emitting layer EL may provide blue light or white light.

The second electrode CE may be disposed on the light emitting layer EL. The second electrode CE may have an integrated shape and be disposed on the plurality of pixels in common. A common voltage may be provided to the second electrode CE, and the second electrode CE may be referred to as a common electrode.

A hole control layer may be disposed between the first electrode AE and the light emitting layer EL. The hole control layer may be disposed on the light emitting area PXA and the non-light emitting area NPXA in common. The hole control layer may include a hole transport layer and further include a hole injection layer. An electron control layer may be disposed between the light emitting layer EL and the second electrode CE. The electron control layer may include an electron transport layer and further include an electron injection layer. The hole control layer and the electron control layer may be provided to the plurality of pixels in common by using an open mask.

The input sensor ISP may be provided directly on a top surface of the upper insulation layer TFL through a single continuous process. The input sensor ISP may include a first sensor insulation layer IIL1, a first conductive layer ICL1, a second sensor insulation layer IIL2, a second conductive layer ICL2, and a third sensor insulation layer IIL3. In an embodiment of the inventive concept, the first sensor insulation layer IIL1 may be omitted.

Each of the first conductive layer ICL1 and the second conductive layer ICL2 may have a single-layered structure or include a plurality of patterns having a multi-layer structure that is laminated in the third direction DR3. The single-layered conductive layer may include a metal layer or a transparent conductive layer. The metal layer may include molybdenum, silver, titanium, copper, aluminum, and/or an alloy thereof. The transparent conductive layer may include a transparent conductive oxide such as an indium tin oxide (ITO), an indium zinc oxide (IZO), a zinc oxide (ZnO), and/or an indium zinc tin oxide (IZTO). In addition, the transparent conductive layer may include a conductive polymer such as PEDOT, a metal nano-wire, or a graphene.

The multi-layered conductive layer may include metal layers. The metal layers may have, e.g., a three-layer structure of titanium/aluminum/titanium. The multi-layered conductive layer may include at least one metal layer and at least one transparent conductive layer.

The second sensor insulation layer IIL2 may cover the first conductive layer ICL1, and the third sensor insulation layer IIL3 may cover the second conductive layer ICL2.

Although each of the first sensor insulation layer IIL1 to the third sensor insulation layer IIL3 is illustrated as a single layer, the embodiment of the inventive concept is not necessarily limited thereto.

At least one of the first sensor insulation layer IIL1 and the second sensor insulation layer IIL2 may include an inorganic layer. The inorganic layer may include an aluminum oxide, a titanium oxide, a silicon oxide, a silicon nitride, a silicon oxynitride, a zirconium oxide, and/or a hafnium oxide.

The third sensor insulation layer IIL3 may include an organic material. The organic layer may include an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, and/or a perylene-based resin.

FIGS. 5A to 5B are plan views illustrating the input sensor ISP according to an embodiment of the inventive concept. FIG. 5B is an enlarged cross-sectional view illustrating the display device DD according to an embodiment of the inventive concept. Hereinafter, the input sensor ISP will be described with reference to FIGS. 5A and 5B in addition to FIG. 4.

Referring to FIG. 5A, the input sensor ISP may include an active area AA and a peripheral area NAA. The input sensor ISP include first sensing electrodes E1-1 to E1-5 (hereinafter, referred to as first electrodes E1-1 to E1-5) and second sensing electrodes E2-1 to E2-4 (hereinafter, referred to as second electrodes E2-1 to E2-4), which are disposed on the active area AA. Five first electrodes E1-1 to E1-5 and four second electrodes E2-1 to E2-4 are illustrated as an example. The first electrodes E1-1 to E1-5 and the second electrodes E2-1 to E2-4 are electrically insulated from each other and cross each other. An area in which the first electrodes E1-1 to E1-5 and the second electrodes E2-1 to E2-4 cross each other may be defined as a crossing area CAA.

The input sensor ISP is disposed on the peripheral area NAA and includes first signal lines SL1 respectively electrically connected to first terminals (or first ends) of the first electrodes E1-1 to E1-5 and second signal lines SL2 respectively electrically connected to first terminals of the second electrodes E2-1 to E2-4. The first signal lines SL1 electrically connect the first electrodes E1-1 to E1-5 to the sensor control circuit T-IC. The second signal lines SL2 electrically connect the second electrodes E2-1 to E2-4 to the sensor control circuit T-IC. For example, the first signal lines SL1 may be electrically connected to the sensor control circuit T-IC through the flexible circuit film FCB and the main circuit board MCB in FIG. 1B.

Each of the first electrodes E1-1 to E1-5 and the second electrodes E2-1 to E2-4 may include a plurality of conductive lines crossing each other. The plurality of conductive lines define a plurality of openings. Each of the first electrodes E1-1 to E1-5 and the second electrodes E2-1 to E2-4 may have a mesh shape.

One of the first electrodes E1-1 to E1-5 and the second electrodes E2-1 to E2-4 may have an integrated shape. In this embodiment, the first electrodes E1-1 to E1-5 having the integrated shape are illustrated as an example. The first electrodes E1-1 to E1-5 may include first sensing portions SP1 and first intermediate portions CP1 disposed between adjacent sensing portions.

The first electrodes E1-1 to E1-5 may be provided from the second conductive layer ICL2 described with reference to FIG. 4. The first signal lines SL1 may also be provided from the second conductive layer ICL2. The first signal lines SL1 may include a line provided from the second conductive layer ICL2 and a line provided from the first conductive layer ICL1, and lines disposed on different layers may be electrically connected through a contact hole passing through the second sensor insulation layer IIL2.

Each of the second electrodes E2-1 to E2-4 may include second sensing portions SP2 and second intermediate portions CP2. The second sensing portions SP2 and the second intermediate portions CP2 may be disposed on different layers. The second sensing portions SP2 may be provided from the second conductive layer ICL2 described with reference to FIG. 4, and the second intermediate portions CP2 may be provided from the first conductive layer ICL1. The second sensing portion SP2 and the second intermediate portion CP2, which are adjacent to each other, may be electrically connected through the contact hole CH-I illustrated in FIGS. 4 and 5A. The second signal lines SL2 extending from the second sensing portion SP2 may also be provided from the second conductive layer ICL2. The second signal lines SL2 may include a line provided from the second conductive layer ICL2 and a line provided from the first conductive layer ICL1, and lines disposed on different layers may be electrically connected through a contact hole passing through the second sensor insulation layer IIL2.

Each of the second sensing portions SP2 may be defined as a sensing pattern, and each of the second intermediate portions CP2 may be defined as a bridge pattern. Although two bridge patterns are disposed for each crossing area CAA as in this embodiment, the embodiment of the inventive concept is not necessarily limited to the number of the bridge patterns. According to an embodiment of the inventive concept, the second electrodes E2-1 to E2-4 may have an integrated shape, and the first electrodes E1-1 to E1-5 may include sensing patterns and bridge patterns, unlike as illustrated in FIG. 5A. In an embodiment of the inventive concept, the first electrodes E1-1 to E1-5 and the second sensing portions SP2 may be provided from the first conductive layer ICL1 in FIG. 4, and the second intermediate portions CP2 may be provided from the second conductive layer ICL2 in FIG. 4.

The input sensor ISP may further include at least first lines WL1 and second lines WL2 disposed on the active area AA. Each of the first lines WL1 and the second lines WL2 may extend to the peripheral area NAA through the active area AA. As the first lines WL1 and the second lines WL2 are disposed on the active area AA, the peripheral area NAA might not increase in surface area for arranging the first lines WL1 and the second lines WL2.

The first line WL1 may have a first terminal (or a first end) electrically connected to a first switching element SW1 that will be described later and a second terminal (or a second end), which faces the first terminal of the first line WL1 in an extension direction of the first line WL1, electrically connected to the above-described flexible circuit film FCB (refer to FIG. 1B). The second line WL2 may have a first terminal electrically connected to a second switching element SW2 that will be described later and a second terminal, which faces the first terminal of the second line WL2 in an extension direction of the second line WL2, electrically connected to the above-described flexible circuit film FCB (refer to FIG. 1B).

The first lines WL1 may extend in the same direction as the first electrodes E1-1 to E1-5, and the second lines WL2 may extend in the same direction as the second electrodes E2-1 to E2-4. In this embodiment, the first lines WL1 one-to-one corresponding to the first electrodes E1-1 to E1-5, and the second lines WL2 one-to-one corresponding to the second electrodes E2-1 to E2-4 are illustrated as an example. As the first lines WL1 one-to-one correspond to the first electrodes E1-1 to E1-5, and the second lines WL2 one-to-one correspond to the second electrodes E2-1 to E2-4, the first electrodes E1-1 to E1-5 may have the same structure as each other, and the second electrodes E2-1 to E2-4 may have the same structure as each other. Thus, a sensitivity difference between the first electrodes E1-1 to E1-5 may be prevented, and a sensitivity difference between the second electrodes E2-1 to E2-4 may be prevented.

The first lines WL1 and the second lines WL2 cross each other in the crossing area CAA in an insulation manner. One of the first lines WL1 and the second lines WL2 may have an integrated shape. Although each of the first lines WL1 may have an integrated shape in this embodiment, the embodiment of the inventive concept is not necessarily limited thereto. The first lines WL1 are disposed on the same layer as the bridge patterns of the first electrodes E1-1 to E1-5 or the second electrodes E2-1 to E2-4. In this embodiment, the first lines WL1 may be provided from the first conductive layer ICL1 of FIG. 4.

Each of the second lines WL2 may include lower portions and upper portions. The lower portions and upper portions may be alternately arranged in the second direction DR2. The lower portions may be provided from the first conductive layer ICL1 of FIG. 4, and the upper portions may be provided from the second conductive layer ICL2 of FIG. 4. A detailed description thereof will be described later with reference to FIGS. 9A to 9C.

The input sensor ISP may further include a first switching element SW1 and a second switching element SW2. In this embodiment, the first switching elements SW1 having a one-to-one correspondence to the first electrodes E1-1 to E1-5, and the second switching elements SW2 having a one-to-one correspondence to the second electrodes E2-1 to E2-4 are illustrated as an example.

Each of the first switching element SW1 and the second switching element SW2 is turned-off during a section (hereinafter, referred to as a first mode) in which the input sensor ISP is operated in a first mode and turned-on during a section (hereinafter, referred to as a second mode) in which the input sensor ISP is operated in a first mode. The first switching element SW1 provides a first current path in each of the first electrodes E1-1 to E1-5 and the corresponding first line WL1 during the second mode and blocks the first current path in each of the first electrodes E1-1 to E1-5 and the corresponding first line WL1 during the first mode. The second switching element SW2 provides a second current path in each of the second electrodes E2-1 to E2-4 and the corresponding second line WL2 during the second mode and blocks the second current path in each of the second electrodes E2-1 to E2-4 and the corresponding second line WL2 during the first mode.

The first switching elements SW1 may be turned-on or turned-off by a first switching signal SWS1 received through a first control signal line CSL1. The second switching elements SW2 may be turned-on or turned-off by a second switching signal SWS2 received through a second control signal line CSL2. Each of the first control signal line CSL1 and the second control signal line CSL2 may receive the switching signal from the sensor control circuit T-IC. For example, the first control signal line CSL1 may be electrically connected to the sensor control circuit T-IC through the flexible circuit film FCB and the main circuit board MCB in FIG. 1B.

In this embodiment, each of the first switching elements SW1 is disposed between the corresponding first electrode E1 among the first electrodes E1-1 to E1-5 and the corresponding first line WL1. Also, each of the second switching elements SW2 is disposed between the corresponding second electrode among the second electrodes E2-1 to E2-4 and the corresponding second line WL2.

Referring to FIG. 5A, a first connection signal line CL1 may be further disposed between each of the first electrodes E1-1 to E1-5 and the corresponding first switching element SW1. The first connection signal line CL1 extends from each of the second terminals of the first electrodes E1-1 to E1-5 facing the first terminals of the first electrodes E1-1 to E1-5 in the second direction DR2. A second connection signal line CL2 may be further disposed between each of the second electrodes E2-1 to E2-4 and the corresponding second switching element SW2. The second connection signal line CL2 extends from each of the second terminals of the second electrodes E2-1 to E2-4 facing the first terminals of the second electrodes E2-1 to E2-4 in the first direction DR1.

The first connection signal line CL1 and the second connection signal line CL2 may be disposed on the same layer as the first sensing portion SP1. The first connection signal line CL1 and the second connection signal line CL2 may be provided from the first conductive layer ICL1 of FIG. 4. However, the embodiment of the inventive concept is not necessarily limited thereto. For example, the first connection signal line CL1 and the second connection signal line CL2 may be omitted. In an embodiment of the inventive concept, the first switching element SW1 may be directly connected to the first electrodes E1-1 to E1-5, and the second switching element SW2 may be directly connected to the second electrodes E2-1 to E2-4.

A connection relationship between the first connection signal line CL1 and the first switching element SW1 and a connection relationship between the first switching element SW1 and the first line WL1 will be described with reference to FIG. 5B. The above connection relationships may be equally applied to a connection relationship between the second connection signal line CL2 and the second switching element SW2 and a connection relationship between the second switching element SW2 and the second line WL2.

Referring to FIG. 5B, the first switching element SW1 may include a transistor TR-S (hereinafter, referred to as a first switching transistor). The first switching transistor TR-S may have the same structure and be disposed on the same layer as the pixel transistor TR-P illustrated in FIG. 4. The first switching transistor TR-S may be manufactured by the same process as the pixel transistor TR-P.

The first switching transistor TR-S may include a semiconductor pattern including a source region SR10, a channel region CHR10, a drain region DR10, and a gate GE10 disposed on a first insulation layer IL1 and at least partially overlapping the channel region CHR10. The gate GE10 may be a portion of the first control signal line CSL1.

In this embodiment, the first line WL1 electrically connected to the source region SR10 and the first connection signal line CL1 electrically connected to the drain region DR10 are illustrated as an example. However, the embodiment of the inventive concept is not necessarily limited thereto. For example, the first connection signal line CL1 may be electrically connected to the source region SR10, and the first line WL1 may be electrically connected to the drain region DR10. A connection relationship between the first switching transistor TR-S and each of the first line WL1 and the first connection signal line CL1 may be changed according to the kind of the first switching transistor TR-S or a level of a biased voltage.

The first line WL1 and the first connection signal line CL1 may be respectively electrically connected to the source region SR10 and the drain region DR10 through a first connection electrode CNE10 and a second connection electrode CNE20. In this embodiment, a thin film encapsulation layer TFE including a first encapsulation inorganic layer IOL1, an encapsulation organic layer OL, and a second encapsulation inorganic layer IOL2 is illustrated as an example of the upper insulation layer TFL. Each of the first line WL1 and the first connection signal line CL1 may be electrically connected to the corresponding second connection electrode CNE20 through a contact hole passing through the first encapsulation inorganic layer IOL1 and the second encapsulation inorganic layer IOL2, which are consecutively laminated in the peripheral area NAA.

FIG. 6 is a view for explaining a first mode of operation of the input sensor ISP. FIG. 7 is a view for explaining a second mode of operation of the input sensor ISP. Hereinafter, an operation of the input sensor ISP will be described with reference to FIGS. 6 and 7 in addition to FIGS. 3A and 5A.

Referring to FIGS. 6 and 7, two first electrodes E1 (E1-1 and E1-2) among the first electrodes E1-1 to E1-5 and two second electrodes E2 (E2-1 and E2-2) among the second electrodes E2-1 to E2-4 of FIG. 5 are illustrated in a simplified maar. Although the first electrodes E1 is illustrated as a transmitting electrode, and the second electrodes E2 is illustrated as a receiving electrode, the embodiment of the inventive concept is not necessarily limited thereto.

Referring to FIG. 6, during the first mode, the first electrodes E1 are electrically connected to the sensor control circuit T-IC (refer to FIG. 3A) through the first signal lines SL1, and the second electrodes E2 are electrically connected to the sensor control circuit T-IC through the second signal lines SL2. During the first mode, all of the first switching element SW1 and the second switching element SW2 are turned-off. The sensor control circuit T-IC provides a driving signal TS1 and TS2 to the first electrodes E1. A mutual capacitor is defined between the first electrodes E1 and the second electrodes E2, and a current path is defined from the first electrodes E1 to the second electrodes E2. The mutual capacitor is disposed in the current path.

The sensor control circuit T-IC may receive a sensing signal RS1 and RS2 from the second electrodes E2. As the first input TC1 (refer to FIG. 3A) is generated, a mutual capacitance between the first electrodes E1 and the second electrodes E2 is varied. The sensor control circuit T-IC calculates the varied mutual capacitance based on the driving signal TS1 and TS2 and the corresponding sensing signal RS1 and RS2. The sensor control circuit T-IC may detect the first input TC1 based on the varied mutual capacitance.

Referring to FIG. 7, during the second mode, the first switching element SW1 is turned-on by the first switching signal SWS1, and the second switching element SW2 is turned-on by the second switching signal SWS2. All of the first line WL1 and the second line WL2 receive a biased voltage Vbias. All of the first line WL1 and the second line WL2 may receive a ground voltage. However, the embodiment of the inventive concept is not necessarily limited to the level of the biased voltage Vbias. A first current path is defined in each of the first electrodes E1, and a second current path is defined in each of the second electrodes E2.

As the second input TC2 (refer to FIG. 3A) is generated, the first electrodes E1 and the second electrodes E2 may receive an input signal of an electromagnetic field from the active-type input unit PN. All of the first electrodes E1 and the second electrode E2 correspond to the receiving electrode. An amount of a current flowing through the first electrodes E1 and the second electrode E2 may be varied by the input signal of the electromagnetic field.

The sensor control circuit T-IC may detect a change of the current flowing through the first electrodes E1 and the second electrode E2 by a sensing signal RSa, RSb, RSc, and RSd. The sensor control circuit T-IC may detect the second input TC2 based on the sensing signal RSa, RSb, RSc, and RSd.

FIGS. 8A and 8B are plan views illustrating the input sensor ISP according to an embodiment of the inventive concept. Hereinafter, differences from the input sensor ISP illustrated in FIG. 5A will be mainly described. To the extent that an element is not described in detail herein, it may be assumed that the element is at least similar to a corresponding element that has been described elsewhere within the present disclosure.

Referring to FIG. 8A, the first switching element SW1 and the second switching element SW2 may be electrically connected to the same control signal line CSL. One portion of the control signal line CSL may be a gate of the first switching elements SW1, and another portion of the control signal line CSL may be a gate of the second switching elements SW2. The first switching elements SW1 and the second switching elements SW2 may be turned-on and turned-off in the same section. As the number of the control signal line CSL decreases, a surface area of the peripheral area NAA may decrease.

Referring to FIG. 8B, the first lines WL1 may be electrically connected to each other within the peripheral area NAA. The first lines WL1 may be electrically connected to the flexible circuit film FCB through one pad PD. For example, the first lines WL1 may have a shape divided from one line. As the number of the first lines WL1 disposed on the peripheral area NAA decreases, the surface area of the peripheral area NAA might not increase.

FIGS. 9A to 9C are enlarged plan views illustrating the crossing area CAA of the input sensor ISP. To the extent that an element is not described in detail herein, it may be assumed that the element is at least similar to a corresponding element that has been described elsewhere within the present disclosure.

Referring to FIGS. 9A to 9C, the first electrode E1 and the second electrode E2 may include first conductive lines 10 extending in a first cross direction DCR1 crossing the first direction DR1 and the second direction DR2 and second conductive lines 20 crossing the first conductive lines 10 and extending in a second cross direction DCR2. The first conductive lines 10 and the second conductive lines 20 at least partially overlap the non-light emitting area NPXA. The first conductive lines 10 and the second conductive lines 20 may define an opening corresponding to the light emitting area PXA. In FIGS. 9A to 9C, only a portion of the light emitting area PXA is illustrated.

In FIG. 9A, conductive patterns provided from the first conductive layer ICL1 of FIG. 4 are illustrated. As illustrated in FIG. 9A, the first line WL1 extends in the second direction DR2. The first line WL1 includes first and second extension portions EP1 and EP2 disposed at both sides of a cross portion AP in the second direction DR2 with respect to the cross portion AP. An opening AP-OP greater in size than an opening EP-OP defined in the first and second extension portions EP1 and EP2 is defined in the cross portion AP. The opening EP-OP defined in the first and second extension portions EP1 and EP2 corresponds to one light emitting area PXA, and the opening AP-OP defined in the cross portion AP corresponds to a plurality of light emitting areas PXA.

In FIG. 9A, a lower portion WL2-L of the second line WL2 is illustrated. The lower portion WL2-L includes a lower bridge portion LBP disposed inside of the opening AP-OP of the cross portion AP and first and second extension portions LEP1 and LEP2 disposed outside of the opening AP-OP of the cross portion AP. The lower bridge portion LBP is disposed between the first and second extension portions LEP1 and LEP2 in the first direction DR1 and spaced apart from the first and second extension portions LEP1 and LEP2.

Although the lower bridge portion LBP having a rhombus shape is illustrated as an example in this embodiment, the embodiment of the inventive concept is not necessarily limited thereto. The lower bridge portion LBP may provide an opening LBP-OP. However, the embodiment of the inventive concept is not necessarily limited thereto. Two portions of the lower bridge portion LBP may be included. The two portions may be defined by dividing the lower bridge portion LBP having the rhombus shape based on the first direction DR1.

Second intermediate portions CP2 may be disposed inside of the opening LBP-OP of the lower bridge portion LBP. As illustrated in FIG. 9A, the two second intermediate portions CP2 may have a shape obtained by dividing the rhombus shape based on the first direction DR1. One of the two second intermediate portions CP2 may have a "<"-shape, and the other may have a ">"-shape.

In FIG. 9B, conductive patterns provided from the second conductive layer ICL2 of FIG. 4 are illustrated. As illustrated in FIG. 9B, the first electrode E1 may extend in the second direction DR2 and have an integrated shape. The first sensing portions SP1 of the first electrode E1 are disposed at both sides of a first intermediate portion CP1 in the second direction DR2 with respect to the first intermediate portion CP1.

The second sensing portions SP2 of the second electrode E2 may be spaced apart from each other with the first intermediate portion CP1 therebetween in the first direction DR1. An upper portion WL2-U includes first and second upper bridge portions UBP1 and UBP2. The first and second upper bridge portions UBP1 and UBP2 are disposed inside of the second sensing portions SP2. The second sensing portions SP2 and the first and second upper bridge portions UBP1 and UBP2 are distinguished from each other through a cut area of the first conductive lines 10 and the second conductive lines 20.

As illustrated in FIG. 9B, the first and second upper bridge portions UBP1 and UBP2 may be at least partially surrounded by the second sensing portions SP2 and the first sensing portions SP1. In an embodiment of the inventive concept, the first and second upper bridge portions UBP1 and UBP2 may be at least partially surrounded by only the second sensing portions SP2.

Referring to FIGS. 9A to 9C, the first and second upper bridge portions UBP1 and UBP2 overlap the cross portion AP of the first line WL1 and are insulated from the cross portion AP of the first line WL1. The first and second upper bridge portions UBP1 and UBP2 connect the lower bridge portion LBP and the first and second extension portions LEP1 and LEP2 through first contact holes CH-11. The second sensing portions SP2 are electrically connected to the second intermediate portions CP2 through second contact holes CH-12. The first contact holes CH-11 and the second contact holes CH-12 correspond to the contact hole CH-I described with reference to FIGS. 4 and 5A.

FIGS. 10 to 12 are plan views illustrating an input sensor according to an embodiment of the inventive concept. To the extent that an element is not described in detail herein, it may be assumed that the element is at least similar to a corresponding element that has been described elsewhere within the present disclosure.

Referring to FIG. 10, the first switching element SW1 is disposed in correspondence to each of the first electrodes E1-1 to E1-5, and the second switching element SW2 is disposed in correspondence to each of the second electrodes E2-1 to E2-4. However, unlike as the input sensor ISP illustrated in FIG. 5A, the first line WL1 is disposed in correspondence to only a portion of the first electrodes E1-1 to E1-5 instead of being disposed for each of the first electrodes E1-1 to E1-5, and the second line WL2 is disposed in correspondence to only a portion of the second electrodes E2-1 to E2-4 instead of being disposed for each of the second electrodes E2-1 to E2-4.

A connection relationship between the first electrodes E1-1 to E1-5, the first switching element SW1, and the first line WL1 will be mainly described. In this embodiment, the first line WL1 may be disposed in correspondence to only a 3-rd first electrode E1-3. The first switching elements SW1 may be respectively electrically connected to the first electrodes E1-1 to E1-5. All of the first switching elements SW1 are electrically connected to the first line WL1 corresponding to the 3-rd first electrode E1-3. An operation of the input sensor ISP during a section in which the first switching elements SW1 are turned-off is the same as that described with reference to FIG. 6, and an operation of the input sensor ISP during a section in which the first switching elements SW1 are turned-on is the same as that described with reference to FIG. 7. As the number of the first lines WL1 decreases, a line structure in the peripheral area NAA becomes simple.

Referring to FIG. 11, a second connection signal line CL20 extending from the second terminals of the second electrodes E2-1 to E2-4 may be directly connected to the second line WL2. The second connection signal line CL20 and the second line WL2 may be electrically connected through the contact hole CH-I. The second switching element SW2 is not disposed between the second connection signal line CL20 and the second line WL2.

The second connection signal line CL20 and the second line WL2 are electrically connected in the peripheral area NAA disposed at one side of the active area AA in the first direction DR1. The second switching element SW2 and the second line WL2 are electrically connected in the peripheral area NAA disposed at the other side of the active area AA in the first direction DR1. The active area AA is disposed between a point at which the second connection signal line CL20 and the second line WL2 are electrically connected (i.e., a point connected by the contact hole CH-I) and a point CNP at which the second switching element SW2 and the second line WL2 are electrically connected in the first direction DR1.

A connection structure of the point at which the second switching element SW2 and the second line WL2 are electrically connected may be the same as that between the first switching transistor TR-S and the first line WL1 illustrated in FIG. 5B. A connection relationship of the first electrodes E1-1 to E1-5, the first lines WL1, and the first switching elements SW1 may also be changed to be the same as the connection relationship of the second electrodes E2-2 to E2-4, the second lines WL2, and the second switching elements SW2.

The second switching elements SW2 may be electrically connected to a voltage line VL receiving a bias voltage. The voltage line VL may receive a bias voltage from a voltage generation circuit mounted to the sensor control circuit T-IC (refer to FIG. 1B) or the main circuit board MCB (refer to FIG. 1B) through the flexible circuit film FCB (refer to FIG. 1B). The voltage line VL may be disposed on the same layer as the gate GE10 or the first connection electrode CNE10 in FIG. 5B.

Referring to FIG. 12, the second switching elements SW2 may be disposed inside of the sensor control circuit T-IC. The second lines WL2 are electrically connected to the sensor control circuit T-IC mounted to the main circuit board MCB through the flexible circuit film FCB.

The second lines WL2 may be electrically connected to the corresponding second switching elements SW2. The second switching elements SW2 that are turned-on by the second switching signal SWS2 may provide the bias voltage to the second lines WL2. The first switching elements SW1 may also be disposed inside of the sensor control circuit T-IC.

As described above, the sensing electrodes may sense the change in the capacitance according to the passive-type input in the first mode. The sensing electrodes may sense the change in the electromagnetic field according to the active-type input in the second mode.

The line electrically connected to the switching element is disposed on the active area instead of the peripheral area. Thus, the surface area of the peripheral area may decrease.

Each of the sensing electrodes may sense the input signal of the electromagnetic field. The sensing channel corresponding to the number of the sensing electrodes may be maintained. The sensitivity may be increased.

Although exemplary embodiments of the present invention have been described herein, it is understood that the present invention not necessarily limited to these exemplary embodiments but various changes and modifications can be made by one ordinary skilled in the art within the spirit and scope of the present disclosure.

What is claimed is:

1. A display device, comprising:
   a base layer having an active area and a peripheral area adjacent to the active area;
   a pixel transistor disposed on the base layer;
   a light emitting element electrically connected to the pixel transistor;
   a thin film encapsulation layer disposed on the light emitting element;
   a plurality of insulation layers disposed on the thin film encapsulation layer;
   a first sensing electrode disposed on the thin film encapsulation layer, extending in a first direction, and disposed on the active area;
   a second sensing electrode disposed on the thin film encapsulation layer, extending in a second direction crossing the first direction, and disposed on the active area;
   a first signal line electrically connected to the first sensing electrode;
   a second signal line electrically connected to the second sensing electrode;
   a first line at least partially overlapping the first sensing electrode in the active area and extending in the first direction in the active area;
   a second line at least partially overlapping the second sensing electrode in the active area and extending in the second direction in the active area;
   a first switching element for switching an electrical connection between the first sensing electrode and the first line; and a second switching element for switching an electrical connection between the second sensing electrode and the second line.

2. The display device of claim 1, wherein the first line and the second line are configured to receive a bias voltage.

3. The display device of claim 1, further comprising a connection signal line electrically connected to the first sensing electrode,
   wherein the first switching element is disposed between the connection signal line and the first line.

4. The display device of claim 3, wherein the connection signal line is disposed above an insulation layer of the plurality of insulation layers, and
   wherein the first line is disposed below the insulation layer of the plurality of insulation layers.

5. The display device of claim 1, wherein the first switching element comprises a switching transistor having a same structure and disposed on a same layer as the pixel transistor.

6. The display device of claim 1, wherein the first switching element is disposed on the peripheral area.

7. The display device of claim 1, wherein the first switching element is turned-on by a first switching signal, and
   wherein the second switching element is turned-on by the first switching signal.

8. The display device of claim 1, wherein the first sensing electrode is provided in plural, and the first line is provided in plural,
   wherein the plurality of first lines correspond one-to-one with the plurality of first sensing electrodes.

9. The display device of claim 8, wherein the plurality of first lines are electrically connected to each other.

10. The display device of claim 1, wherein the first sensing electrode comprises first sensing portions arranged in the first direction and first intermediate portions disposed between adjacent first sensing portions among the first sensing portions,
    wherein the second sensing electrode comprises second sensing portions arranged in the second direction and second intermediate portions disposed between adjacent second sensing portions among the second sensing portions,
    wherein the first sensing portions and the second sensing portions are disposed above an insulation layer of the plurality of insulation layers, and
    wherein one intermediate portion of the first intermediate portions and the second intermediate portions are disposed above the insulation layer, and other intermediate portions are disposed below the insulation layer.

11. The display device of claim 10,
    wherein one line of the first line and the second line has an integrated shape and is disposed above the insulation layer, and
    wherein another line of the first line and the second line comprises an upper portion disposed above the insulation layer and a lower portion disposed below the insulation layer.

12. The display device of claim 11, wherein the one intermediate portion, of the first and second intermediate portions, is disposed in an area where the first sensing electrode crosses the second sensing electrode, and
    wherein the one intermediate portion connects corresponding two first sensing portions among the first sensing portions or corresponding two second sensing portions among the second sensing portions.

13. The display device of claim 12, wherein an opening is defined in the one line in an area where the first line crosses the second line, wherein the lower portion comprises a lower bridge portion disposed inside of the opening and first and second extension portions disposed outside of the opening, wherein the lower bridge portion is disposed between the first and second extension portions, and wherein the upper portion comprises a first upper bridge portion connecting the lower bridge portion and the first extension portion to each other and a second upper bridge portion connecting the lower bridge portion and the second extension portion to each other.

14. The display device of claim 1, wherein the first sensing electrode is provided in plural, wherein the first switching element is provided in plural, wherein the plurality of first switching elements correspond one-to-one with the plurality of first sensing electrodes, wherein the first line overlaps one first sensing electrode among the plurality of first sensing electrodes, and wherein each of the plurality of first switching elements are electrically connected to the first line.

15. The display device of claim 1, further comprising a connection signal line disposed between the first line and the first sensing electrode, wherein the first line and the connection signal line are electrically connected to each other, and wherein the first line and the connection signal line are disposed on different layers from each other.

16. The display device of claim 15, further comprising a voltage line configured to receive a bias voltage, wherein the first line is disposed between the connection signal line and the first switching element, and wherein the first switching element is disposed between the first line and the voltage line.

17. The display device of claim 15, wherein the first line is disposed between the connection signal line and the first switching element, and wherein the first switching element is disposed inside of a sensor control circuit.

18. The display device of claim 17, further comprising:

a flexible circuit film electrically connected to the first signal line, the second signal line, the first line, and the second line; and a main circuit board electrically connected to the flexible circuit film, wherein the sensor control circuit is disposed on the flexible circuit film or the main circuit board.

19. An electronic device, comprising:

an electronic pen configured to output an electromagnetic transmission signal; and an input sensor including an active area and a peripheral area disposed around the active area; and configured to sense the electromagnetic transmission signal, wherein the input sensor comprises:

a sensing electrode disposed in the active area;

a signal line electrically connected to the sensing electrode;

a line at least partially overlapping the sensing electrode in the active area, extending in a same direction as the sensing electrode in the active area, and configured to receive a bias voltage; and a switching element configured to switch an electrical connection between the sensing electrode and the line.

20. The electronic device of claim 19, further comprising a connection signal line electrically connected to the sensing electrode, wherein the switching element is disposed between the connection signal line and the line.

* * * * *